(12) United States Patent
Shim et al.

(10) Patent No.: US 12,538,676 B2
(45) Date of Patent: Jan. 27, 2026

(54) DISPLAY APPARATUS

(71) Applicant: Samsung Display Co., Ltd., Yongin-si (KR)

(72) Inventors: Junghoon Shim, Yongin-si (KR); Daehyun Kim, Yongin-si (KR); Hansung Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 18/331,824

(22) Filed: Jun. 8, 2023

(65) Prior Publication Data
US 2023/0403899 A1   Dec. 14, 2023

(30) Foreign Application Priority Data
Jun. 9, 2022   (KR) .................. 10-2022-0070297

(51) Int. Cl.
| | |
|---|---|
| *H10K 59/131* | (2023.01) |
| *G09G 3/20* | (2006.01) |
| *G09G 3/3225* | (2016.01) |
| *G09G 3/3275* | (2016.01) |
| *H10K 59/121* | (2023.01) |
| *H10K 59/35* | (2023.01) |

(52) U.S. Cl.
CPC ....... *H10K 59/131* (2023.02); *H10K 59/1213* (2023.02); *H10K 59/351* (2023.02); *H10K 59/353* (2023.02)

(58) Field of Classification Search
CPC .. H10K 59/131; H10K 59/353; H10K 59/351; H10K 59/35; H10K 59/1213; G09G 3/2074; G09G 2300/0439
See application file for complete search history.

(56) References Cited

U.S. PATENT DOCUMENTS

| | | | |
|---|---|---|---|
| 6,614,498 B1 | 9/2003 | Tanaka et al. | |
| 9,704,424 B2 | 7/2017 | Sun | |
| 2011/0075062 A1* | 3/2011 | He | G09G 3/3614 349/42 |

(Continued)

FOREIGN PATENT DOCUMENTS

| | | |
|---|---|---|
| JP | 2004-4725 A | 1/2004 |
| KR | 10-2018-0072303 A | 6/2018 |

(Continued)

*Primary Examiner* — Mohsen Ahmadi
(74) *Attorney, Agent, or Firm* — Womble Bond Dickinson (US) LLP

(57) ABSTRACT

A display apparatus includes first and second data lines extending in a first direction, and an array of sub-pixels including first sub-pixels of a first color, second sub-pixels of a second color, and third sub-pixels of a third color, wherein the array of the sub-pixels includes a first sub-pixel column adjacent to the first data line, and in which one of the first sub-pixels, which is electrically connected to the first data line, and one of the second sub-pixels, which is electrically connected to the second data line, are alternately arranged in the first direction, and a second sub-pixel column adjacent to the second data line, and in which another of the first sub-pixels, which is electrically connected to the first data line, and another of the second sub-pixels, which is electrically connected to the second data line, are alternately arranged in the first direction.

17 Claims, 16 Drawing Sheets

(56) References Cited

U.S. PATENT DOCUMENTS

| | | | | |
|---|---|---|---|---|
| 2012/0092241 | A1* | 4/2012 | Shang | G09G 3/3648 |
| | | | | 345/87 |
| 2018/0174511 | A1 | 6/2018 | Kim et al. | |
| 2018/0315801 | A1* | 11/2018 | Matsueda | H10K 59/1315 |
| 2019/0259331 | A1 | 8/2019 | Na | |
| 2020/0365079 | A1 | 11/2020 | Cha et al. | |
| 2021/0049971 | A1* | 2/2021 | Xiao | G06F 3/0412 |
| 2021/0074225 | A1 | 3/2021 | Yoon et al. | |
| 2021/0233455 | A1 | 7/2021 | Yang et al. | |
| 2022/0206351 | A1* | 6/2022 | Hwang | G09G 3/3688 |
| 2022/0208121 | A1* | 6/2022 | Lee | G09G 3/3291 |
| 2022/0366828 | A1 | 11/2022 | Park et al. | |
| 2022/0392923 | A1* | 12/2022 | Oh | H10D 86/60 |
| 2022/0415258 | A1* | 12/2022 | Park | G09G 3/3241 |
| 2023/0127526 | A1 | 4/2023 | Park et al. | |

FOREIGN PATENT DOCUMENTS

| | | |
|---|---|---|
| KR | 10-2019-0062679 A | 6/2019 |
| KR | 10-2019-0100550 A | 8/2019 |
| KR | 10-2020-0014465 A | 2/2020 |
| KR | 10-2020-0015870 A | 2/2020 |
| KR | 10-2022-0156147 A | 11/2022 |
| KR | 10-2023-0059889 A | 5/2023 |

* cited by examiner

DISPLAY APPARATUS

CROSS-REFERENCE TO RELATED APPLICATION

This application claims priority to, and the benefit of, Korean Patent Application No. 10-2022-0070297, filed on Jun. 9, 2022, in the Korean Intellectual Property Office, the disclosure of which is incorporated by reference herein in its entirety.

BACKGROUND

1. Field

One or more embodiments relate to a display apparatus.

2. Description of the Related Art

In general, a display apparatus includes a display panel, on which images are displayed, and a driving circuit for driving the display panel. The display panel includes scan lines, data lines, and pixels. The driving circuit includes a data driving circuit for outputting a data driving signal, a scan driving circuit for outputting a scan signal for driving scan lines, and a controller for controlling the data driving circuit and the scan driving circuit.

Such a display apparatus may display an image by outputting a scan signal to a scan line connected to a pixel to be operated, and by providing a data voltage corresponding to the displayed image to a data line connected to a pixel.

SUMMARY

One or more embodiments provide a display apparatus in which power consumption decreases, and in which dead space is reduced. However, this is merely an example, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate, a first data line and a second data line above the substrate and extending in a first direction, and an array of sub-pixels above the substrate, and including first sub-pixels for emitting light of a first color, second sub-pixels for emitting light of a second color, and third sub-pixels for emitting light of a third color, wherein the array of the sub-pixels includes a first sub-pixel column adjacent to the first data line, and in which one of the first sub-pixels, which is electrically connected to the first data line, and one of the second sub-pixels, which is electrically connected to the second data line, are alternately arranged in the first direction, and a second sub-pixel column adjacent to the second data line, and in which an other of the first sub-pixels, which is electrically connected to the first data line, and an other of the second sub-pixels, which is electrically connected to the second data line, are alternately arranged in the first direction.

The one of the first sub-pixels in the first sub-pixel column and the other of the second sub-pixels in the second sub-pixel column may be in a same row extending in a second direction perpendicular to the first direction.

The first data line may be configured to supply a first data signal corresponding to the first color, wherein the second data line is configured to supply a second data signal corresponding to the second color.

The display apparatus may further include a third data line above the substrate, between the first data line and the second data line, and extending in the first direction.

The array of the sub-pixels may further include a third sub-pixel column between the first sub-pixel column and the second sub-pixel column, and including one of the third sub-pixels that is electrically connected to the third data line.

The display apparatus may further include a fourth data line above the substrate and extending in the first direction, wherein the second data line is between the third data line and the fourth data line.

The array of the sub-pixels may further include a third sub-pixel column between the first sub-pixel column and the second sub-pixel column, and including one of the third sub-pixels that is electrically connected to the third data line, and a fourth sub-pixel column adjacent to the second sub-pixel column and including a fourth sub-pixel connected to the fourth data line, and wherein the second sub-pixel column is between the fourth sub-pixel column and the third sub-pixel column.

The array of the sub-pixels may further include a fourth sub-pixel column adjacent to the second sub-pixel column, and in which an additional one of the first sub-pixels and an additional one of the second sub-pixels are alternately arranged in the first direction, the additional one of the second sub-pixels and the other of the first sub-pixels in the second sub-pixel column being in a same row extending in a second direction that is perpendicular to the first direction.

One of the first color and the second color may be red, wherein the other of the first color and the second color is blue, and wherein the third color is green.

According to one or more embodiments, a display apparatus includes a substrate, a first data line and a second data line above the substrate and extending in a first direction, and an array of sub-pixels above the substrate, and including first sub-pixels respectively including first light-emitting diodes for emitting light of a first color, second sub-pixels respectively including second light-emitting diodes for emitting light of a second color, and third sub-pixels respectively including third light-emitting diodes for emitting light of a third color, wherein the array of the sub-pixels includes a first sub-pixel column adjacent to the first data line, and in which one of the first sub-pixels and one of the second sub-pixels are alternately arranged in the first direction, and a second sub-pixel column adjacent to the second data line, and in which an other of the first sub-pixels and an other of the second sub-pixels are alternately arranged in the first direction, wherein one of the first light-emitting diodes corresponding to the one of the first sub-pixels in the first sub-pixel column is electrically connected to a 1-1 sub-pixel circuit electrically connected to the first data line, and wherein an other of the first light-emitting diodes corresponding to the other of the first sub-pixels in the second sub-pixel column is electrically connected to a 2-1 sub-pixel circuit that is electrically connected to the first data line and that is in a same column as the 1-1 sub-pixel circuit.

An other of the second light-emitting diodes corresponding to the other of the second sub-pixels in the second sub-pixel column may be electrically connected to a 1-2 sub-pixel circuit electrically connected to the second data line, wherein one of the second light-emitting diodes corresponding to the one of the second sub-pixels in the first sub-pixel column is electrically connected to a 2-2 sub-pixel circuit that is electrically connected to the second data line and that is in a same column as the 1-2 sub-pixel circuit.

The one of the first sub-pixels in the first sub-pixel column and the other of the second sub-pixels in the second sub-pixel column may be in a same row in a second direction perpendicular to the first direction.

The first data line may be configured to provide a first data signal of the first color, wherein the second data line is configured to provide a second data signal of the second color.

The display apparatus may further include a third data line between the first data line and the second data line, wherein a connection line connecting the 2-1 sub-pixel circuit to the other of the first light-emitting diodes corresponding to the other of the first sub-pixels in the second sub-pixel column crosses the third data line.

The array of the sub-pixels may further include a third sub-pixel column between the first sub-pixel column and the second sub-pixel column and including one of the third sub-pixels, wherein one of the third light-emitting diodes corresponding to the one of the third sub-pixels in the third sub-pixel column is electrically connected to a sub-pixel circuit electrically connected to the third data line.

The third data line may be configured to provide a third data signal of the third color.

The first, second, and third light-emitting diodes may each have a stack structure including a sub-pixel electrode, an emission layer, and an opposite electrode.

The sub-pixel electrode of the one of the first light-emitting diodes in the first sub-pixel column and the sub-pixel electrode of the one of the second light-emitting diodes in the first sub-pixel column may overlap the first data line.

The sub-pixel electrode of the other of the first light-emitting diodes in the second sub-pixel column and the sub-pixel electrode of the other of the second light-emitting diodes in the second sub-pixel column may overlap the second data line.

One of the first color and the second color may be red, wherein the other of the first color and the second color is blue, and wherein the third color is green.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
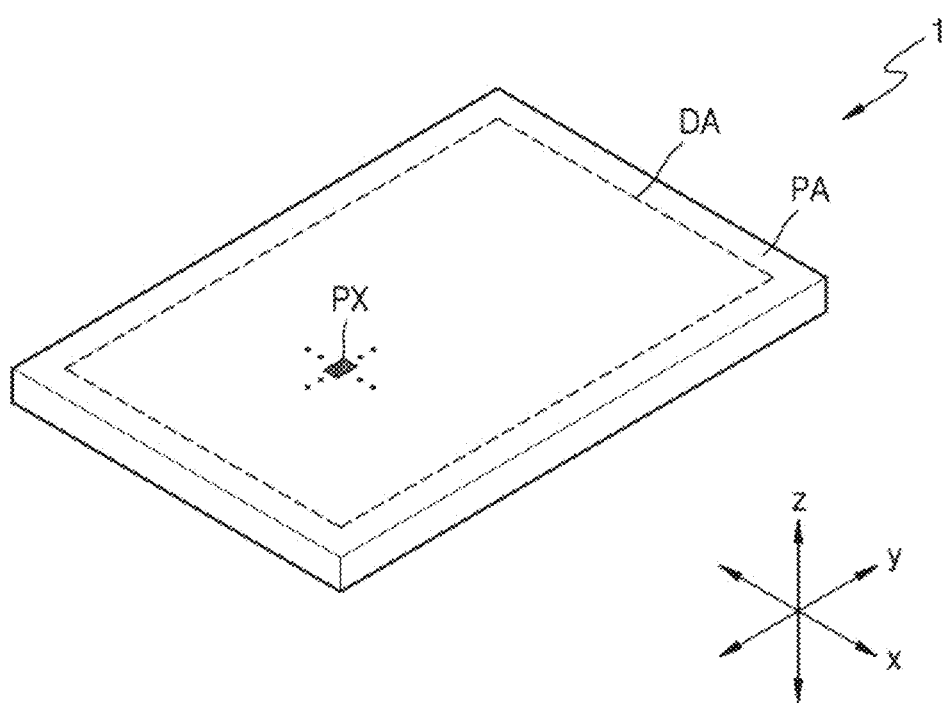
FIG. 1 is a schematic perspective view of a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes,"

and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

In embodiments below, when a wire is referred to as "extending in a first direction or a second direction," the wire may extend in a straight line or extend in a zigzag form or in a curve in the first direction or the second direction.

In embodiments below, the expression "on a plan view" may indicate that an object is viewed from the top, and the expression "on a cross-sectional view" may indicate that a cross-section of a target portion, which is vertically cut, is viewed from the side. When an element "overlaps" another element, the element may overlap the other element "on a plan view" and "a cross-sectional view."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, one or more embodiments of the disclosure will be described in detail with reference to the accompanying drawings, and like elements in the drawings denote like elements.

FIG. 1 is a schematic perspective view of a display apparatus according to one or more embodiments.

In one or more embodiments, a display apparatus 1 may display a moving image or a still image, and may be used as a display screen of various products, for example, a portable electric apparatus, such as a mobile phone, a smartphone, a tablet Personal Computer, a mobile communication terminal, a personal digital assistant, an e-book terminal, a Portable Multimedia Player (PMP), a navigation device, or an Ultra Mobile PC (UMPC), a television (TV), a laptop, a monitor, a billboard, an Internet of Things (IoT) device, and the like.

Also, in one or more embodiments, the display apparatus 1 may be used in a wearable device, such as a smartwatch, a watch phone, an eyewear display, or a head-mounted display (HMD). Also, in one or more embodiments, the display apparatus 1 may be used as a display screen in an instrument cluster of a vehicle, a Center Information Display (CID) mounted on a center fascia or a dashboard of a vehicle, a room mirror display replacing a side-view mirror of a vehicle, or a car headrest monitor provided for rear-seat entertainment. For convenience of explanation, FIG. 1 shows that the display apparatus 1 is used as a smartphone.

Referring to FIG. 1, the display apparatus 1 may include a display area DA, and a peripheral area PA on an outer side of the display area DA. FIG. 1 shows that a shape of the display area DA is substantially a rectangle, but one or more embodiments are not limited thereto. The display area DA may be in various shapes, such as a circle, an oval, and a polygon.

The display area DA may be an area where an image is displayed, and a plurality of sub-pixels PX may be arranged in the display area DA. Each sub-pixel PX may include a light-emitting diode, such as an organic light-emitting diode. Each sub-pixel PX may emit, for example, red light, green light, blue light, or white light.

The display area DA may provide a corresponding image by using light emitted from the sub-pixels PX. In the present specification, the sub-pixel PX may be defined as an emission area where any one of red, green, blue, and white light is emitted, as described above.

The peripheral area PA may be an area where no sub-pixels PX are arranged and where no images are provided. A terminal, etc., may be arranged in the peripheral area PA, wherein a printed circuit board or a driver IC including a power supply line for driving the sub-pixels PX and driving circuitry may be connected to the terminal, etc.

Hereinafter, an organic light-emitting display apparatus is described as an example of the display apparatus 1 according to one or more embodiments. However, the display apparatus 1 is not limited thereto. For example, the display apparatus 1 may be an inorganic light-emitting display apparatus (or an inorganic EL display apparatus), or a quantum dot light-emitting display apparatus. For example, an emission layer of a light-emitting diode included in the display apparatus 1 may include an organic material or an inorganic material. Quantum dots may be located in a path of light emitted from the emission layer.

Figure 2:
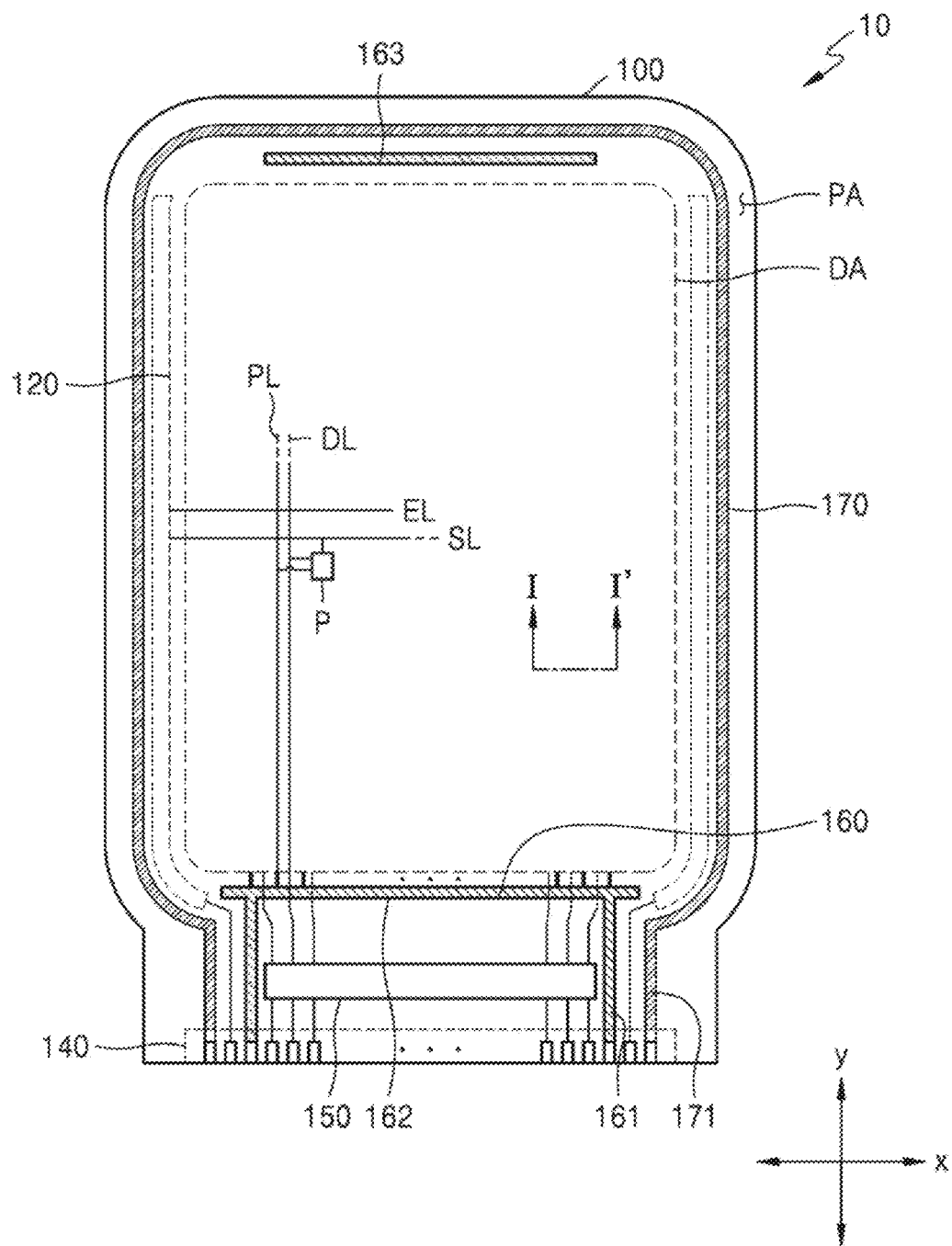
FIG. 2 is a schematic plan view of a display panel that may be included in a display apparatus, according to one or more embodiments.

FIG. 2 is a schematic plan view of a display panel that may be included in a display apparatus, according to one or more embodiments.

Referring to FIG. 2, the display apparatus 1 may include a display panel 10 on which images are displayed. The display panel 10 may include the sub-pixels PX arranged in the display area DA. The sub-pixels PX may be electrically connected to outer circuits arranged in the peripheral area PA, respectively. In the peripheral area PA, driving circuits 120, a pad portion 140, a data driving circuit 150, a first power supply line 160, and a second power supply line 170 may be arranged.

The driving circuit 120 may provide a scan signal to each sub-pixel PX through a scan line SL, and an emission control signal to each sub-pixel PX through an emission control line EL. Some of the sub-pixels PX arranged in the display area DA may be electrically connected to at least any one of the driving circuits 120 arranged on the left side or the right side of the display area DA.

The pad portion 140 may be on one side of, or one end of, a substrate 100. The pad portion 140 may not be covered by an insulating layer and may be exposed, thus being electrically connected to a printed circuit board. The pad portion 140 may be electrically connected to a pad portion of the printed circuit board. The printed circuit board may be configured to transmit a signal or power from a controller to the display panel 10, in one or more embodiments.

Control signals generated by the controller may be transmitted to the driving circuits 120 arranged on the left side and/or the right side of the display area DA through the printed circuit board. The controller may provide a first power voltage to the first power supply line 160 through a first connection line 161, and may provide a second power voltage to the second power supply line 170 through a second connection line 171.

The first power voltage may be provided to each sub-pixel PX through a driving power line PL connected to the first power supply line 160, and the second power voltage may be provided to an opposite electrode of each sub-pixel PX connected to the second power supply line 170. The driving power line PL may extend in a first direction (e.g., a y direction). For example, the first power voltage may be a driving voltage ELVDD, and the second power voltage may be a common voltage ELVSS.

The data driving circuit 150 may be electrically connected to the data line DL. The data signal of the data driving circuit 150 may be provided to each sub-pixel PX through a connection wire connected to the pad portion 140 and to the data line DL connected to the connection wire. FIG. 2 shows that the data driving circuit 150 is arranged between the first power supply line 160 and the pad portion 140 on the substrate 100, but in one or more other embodiments, the data driving circuit 150 may be arranged on the printed circuit board.

The first power supply line 160 may include, for example, a first sub-line 162 and a second sub-line 163 that both extend in parallel in a second direction (e.g., an x direction) with the display area DA therebetween. The second power supply line 170 may have a loop shape with one open side and may partially surround the display area DA.

Figure 3:
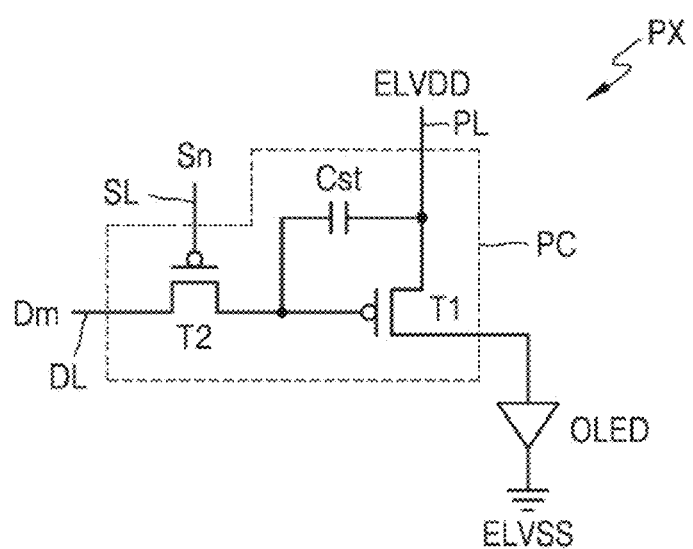
FIG. 3 is a schematic equivalent circuit diagram of a light-emitting diode of a display panel and a sub-pixel circuit electrically connected to the light-emitting diode, according to one or more embodiments.

FIG. 3 is a schematic equivalent circuit diagram of a light-emitting diode of a display panel and a sub-pixel circuit electrically connected to the light-emitting diode, according to one or more embodiments.

Referring to FIG. 3, each sub-pixel PX may include the sub-pixel circuit PC connected to a scan line SL and to a data line DL, and an organic light-emitting diode OLED connected to the sub-pixel circuit PC. The sub-pixel circuit PC may include a driving thin film transistor T1, a switching thin film transistor T2, and a storage capacitor Cst. The switching thin film transistor T2 may be connected to the scan line SL and to the data line DL, and may be configured to transmit, to the driving thin film transistor T1, a data signal Dm that is input through the data line DL in response to a scan signal Sn that is input through the scan line SL.

The storage capacitor Cst may be connected to the switching thin film transistor T2 and the driving power line PL, and may be configured to store a voltage corresponding to a difference between a voltage from the switching thin film transistor T2 and a first power voltage supplied to the driving power line PL.

The driving thin film transistor T1 may be connected to the driving power line PL and the storage capacitor Cst, and may be configured to control a driving current flowing in the organic light-emitting diode OLED from the driving voltage line PL according to a value of the voltage stored in the storage capacitor Cst. The organic light-emitting diode OLED may emit light having a corresponding brightness because of the driving current.

FIG. 3 shows that the sub-pixel circuit PC includes two thin film transistors and one storage capacitor, but one or more embodiments are not limited thereto. For example, in one or more other embodiments, the sub-pixel circuit PC may include seven thin film transistors and one storage capacitor or two storage capacitors.

Figure 4:
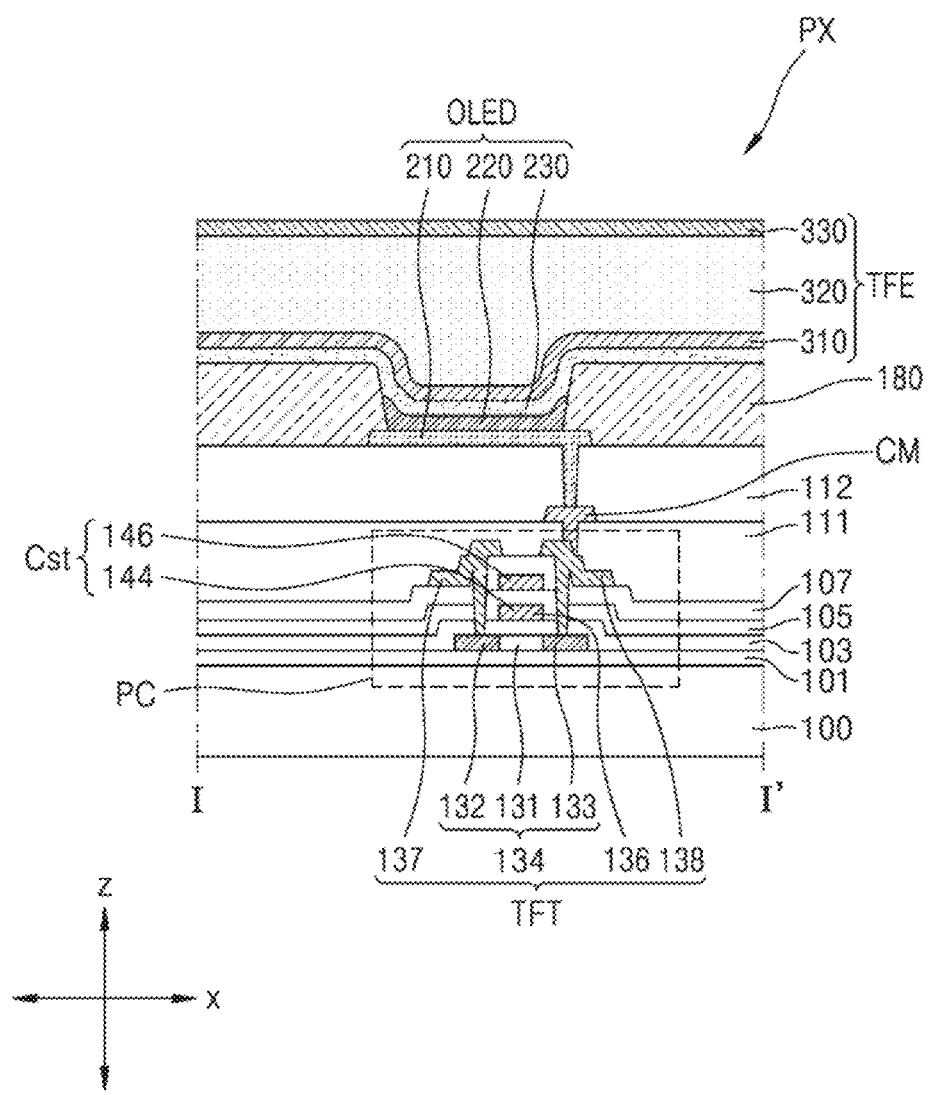
FIG. 4 is a schematic cross-sectional view of a portion of a display panel, according to one or more embodiments.

FIG. 4 is a cross-sectional view of a display panel taken along the line I-I' of FIG. 2. In detail, FIG. 4 shows a stack structure of the sub-pixels PX of the display panel 10, according to one or more embodiments.

Referring to FIG. 4, the display panel 10 may include the substrate 100, a thin film transistor TFT arranged on the substrate 100, the organic light-emitting diode OLED connected to the thin film transistor TFT and arranged thereon, and a thin film encapsulation layer TFE arranged on the organic light-emitting diode OLED.

The substrate 100 may include glass or polymer resin. The polymer resin may include polyethersulfone, polyarylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayered structure that includes a layer including the above polymer resin and inorganic layers, in one or more embodiments.

A buffer layer 101 may be on the substrate 100, may decrease or prevent the penetration of foreign materials, moisture, or external air from the bottom of the substrate 100, and may provide a flat surface on the substrate 100. The buffer layer 101 may include an inorganic material, such as oxide or nitride, an organic material, or a compound thereof, and may be a layer or layers including organic and inorganic materials.

On the substrate 100, the thin film transistor TFT, the storage capacitor Cst, and the organic light-emitting diode OLED electrically connected to the thin film transistor TFT and the storage capacitor Cst may be arranged at a location corresponding to the display area DA. The thin film transistor TFT of FIG. 4 may correspond to any one of the thin film transistors included in the sub-pixel circuit PC described with reference to FIG. 3, for example, the driving thin film transistor T1.

The thin film transistor TFT may include a semiconductor layer 134, a gate electrode 136, a source electrode 137, and a drain electrode 138. The semiconductor layer 134 may include a channel area 131 overlapping the gate electrode 136, and a source area 132 and a drain area 133 that are arranged at respective sides of the channel area 131 and that respectively include impurities having a greater concentration than that of the channel area 131. Here, the impurities may include N-type impurities or P-type impurities. The source area 132 and the drain area 133 may be respectively electrically connected to the source electrode 137 and the drain electrode 138 of the thin film transistor TFT.

The semiconductor layer 134 may include an oxide semiconductor and/or a silicon semiconductor. When the semiconductor layer 134 includes an oxide semiconductor, the semiconductor layer 134 may include, for example, oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include InSnZnO (ITZO), InGaZnO (IGZO), or the like. When the semiconductor layer 134 includes a silicon semiconductor, the semiconductor layer 134 may include, for example, Low Temperature Poly-Silicon (LTPS) obtained by crystallizing amorphous silicon or amorphous silicon.

The gate electrode 136 may include at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be a layer or layers including one or more of the above materials. The gate electrode 136 may be connected to a gate line through which an electrical signal is applied to the gate electrode 136.

A gate insulating layer 103 may be arranged between the semiconductor layer 134 and the gate electrode 136, and thus, the semiconductor layer 134 may be insulated from the gate electrode 136. The gate insulating layer 103 may include at least one inorganic insulating material selected from the group consisting of silicon oxide, silicon nitride, silicon oxynitride, aluminum oxide, titanium oxide, tantalum oxide, hafnium oxide, and zinc oxide. The gate insulating layer 103 may have a single-layer structure or a multilayered structure including the above inorganic insulating material(s).

The storage capacitor Cst may include a lower electrode 144, and an upper electrode 146 above the lower electrode 144. The lower electrode 144 of the storage capacitor Cst may overlap the upper electrode 146 thereof. In one or more embodiments, the gate electrode 136 of the thin film transistor TFT may include the lower electrode 144 of the storage capacitor Cst.

A first interlayer insulating layer 105 may be arranged between the lower electrode 144 and the upper electrode 146. The first interlayer insulating layer 105 may be a layer having a corresponding dielectric constant, include an inorganic insulating material, such as silicon oxynitride, silicon oxide, and/or silicon nitride, and have a single-layer structure or a multilayered structure.

FIG. 4 shows that the storage capacitor Cst overlaps the thin film transistor TFT and the lower electrode 144 is formed integrally with the gate electrode 136 of the thin film transistor TFT, but in one or more other embodiments, the storage capacitor Cst may not overlap the thin film transistor TFT, and the lower electrode 144 may be a component formed independently from the gate electrode 136 of the thin film transistor TFT.

A second interlayer insulating layer 107 may be arranged on the upper electrode 146 of the storage capacitor Cst. The second interlayer insulating layer 107 may include at least one inorganic insulating material selected from the group consisting of silicon oxide, silicon nitride, silicon oxynitride, aluminum oxide, titanium oxide, tantalum oxide, hafnium oxide, and zinc oxide. The second interlayer insulating layer 107 may have a single-layer structure or a multilayered structure including one or more of the above materials.

The source electrode 137 and the drain electrode 138 may be arranged on the second interlayer insulating layer 107. The source electrode 137 and the drain electrode 138 may each include a material, such as Mo, Al, Cu, and/or Ti, and may have a single-layer structure or a multilayered structure including one or more of the above materials. The source electrode 137 and the drain electrode 138 may each have a multilayered structure of Ti/Al/Ti. In one or more embodiments, the source electrode 137 and the drain electrode 138 may include the same materials as the first power supply line 160 and the second power supply line 170.

The sub-pixel circuit PC including the thin film transistor TFT and the storage capacitor Cst may be electrically connected to a sub-pixel electrode 210 of the organic light-emitting diode OLED. In one or more embodiments, as shown in FIG. 4, the sub-pixel circuit PC may be electrically connected to the sub-pixel electrode 210 through a connection electrode CM. In one or more other embodiments, an additional connection electrode may be further arranged between the sub-pixel circuit PC and the sub-pixel electrode 210. In this case, the sub-pixel circuit PC may be electrically connected to the sub-pixel electrode 210 through the connection electrode CM and the additional connection electrode. Alternatively, the sub-pixel circuit PC may be directly electrically connected to the sub-pixel electrode 210 without the connection electrode CM.

The connection electrode CM may be arranged on a first planarization layer 111 and may be connected to the sub-pixel circuit PC through a contact hole formed in the first planarization layer 111. The connection electrode CM may include Al, Pt, Pd, Ag, Mg, Au, Ni, Nd, Ir, Cr, Ni, calcium (Ca), Mo, Ti, W, and/or Cu, and may have a single-layer structure or a multilayered structure including one or more of the above materials.

The first planarization layer 111 may include an inorganic insulating material and/or an organic insulating material. The first planarization layer 111 may include, for example, an inorganic insulating material, such as silicon oxide, silicon oxynitride, or silicon nitride. The first planarization layer 111 may include, for example, an organic insulating material, such as acryl, benzocyclobutene (BCB), polyimide, or hexamethyldisiloxane (HMDSO).

A second planarization layer 112 may be arranged on the connection electrode CM. The second planarization layer 112 may include an inorganic insulating material and/or an organic insulating material. The second planarization layer 112 may include, for example, an inorganic insulating material, such as silicon oxide, silicon oxynitride, or silicon nitride. The second planarization layer 112 may include, for example, an organic insulating material, such as acryl, BCB, polyimide, or HMDSO.

On the second planarization layer 112, there may be the organic light-emitting diode OLED including a sub-pixel electrode 210, an intermediate layer 220, and an opposite electrode 230 facing the sub-pixel electrode 210 with the intermediate layer 220 therebetween. The sub-pixel electrode 210 may contact the connection electrode CM through the contact hole in the second planarization layer 112.

The sub-pixel electrode 210 may be a (semi-)light-transmissive electrode or a reflection electrode. In some embodiments, the sub-pixel electrode 210 may include a reflection layer including Ag, Mg, Al, Pt, Pd, Au, Ni, Nd, Ir, Cr, and a compound thereof, and a transparent or translucent electrode layer formed on the reflection layer. The transparent or translucent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the sub-pixel electrode 210 may have a stack structure of ITO/Ag/ITO.

A bank layer 180 may be arranged on the second planarization layer 112, and may have an opening through which a central portion of the sub-pixel electrode 210 is exposed. The opening of the bank layer 180 may define an emission area EA of the organic light-emitting diode OLED, and the emission area EA of the organic light-emitting diode OLED may correspond to the sub-pixel PX. Also, the bank layer 180 may reduce or prevent the likelihood of arcs, etc., being generated at edges of the sub-pixel electrode 210 by increasing a distance between the edges of the sub-pixel electrode 210, and the opposite electrode 230 that is arranged above the sub-pixel electrode 210. The bank layer 180 may include, for example, organic insulating materials, such as polyimide, polyamide, acryl resin, BCB, HMDSO, and phenol resin.

In one or more embodiments, a spacer may be arranged on the bank layer 180. The spacer may reduce or prevent the likelihood of damage to the organic light-emitting diode OLED caused by the sagging of a mask during manufacturing processes using the mask. The spacer may include, for example, organic insulating materials, such as polyimide, polyamide, acryl resin, BCB, HMDSO, and phenol resin, and may be a layer or layers.

The intermediate layer 220 may be located on the sub-pixel electrode 210 exposed by the bank layer 180. The intermediate layer 220 may include an emission layer, and under and on the emission layer, functional layers, such as a hole transport layer (HTL), a hole injection layer (HIL), an electron transport layer (ETL), and an electron injection layer (EIL), may be further located, respectively.

The emission layer may include an organic material including a fluorescent or phosphorescent material emitting red light, green light, blue light, or white light. The emission layer may be a low-molecular-weight or high-molecular-weight organic material.

When the emission layer includes a low-molecular-weight material, the intermediate layer 220 may have a single-layer structure or a stack structure in which an HIL, an HTL, an emission layer, an EIL, and an ETL are stacked, and may include various organic materials including copper phthalocyanine (CuPc), N,N'-Di(napthalene-1-yl)-N,N'-diphenyl-benzidine (NPB), and tris-8-hydroxyquinoline aluminum ($Alq_3$) as low-molecular-weight organic materials.

When the emission layer includes a high-molecular-weight material, the intermediate layer 220 may have a structure including an HTL and an EML. In this case, the HTL may include PEDOT, and the emission layer may include a high-molecular-weight material, such as a polyphenylene vinylene (PPV)-based material and a polyfluorene-based material.

The sub-pixel electrode 210 may be provided in plural, and the intermediate layer 220 may be arranged corresponding to each sub-pixel electrode 210. However, one or more embodiments are not limited thereto. Various modifications may be made to the intermediate layer 220. For example, the intermediate layer 220 may include a layer integrally formed over the sub-pixel electrodes 210. In one or more embodiments, the emission layer of the intermediate layer 220 may be arranged corresponding to each sub-pixel electrode 210, and the functional layer(s) except for the emission layer may be integrally formed over the sub-pixel electrodes 210.

The opposite electrode 230 may be arranged on the intermediate layer 220. The opposite electrode 230 may be on the intermediate layer 220 and entirely cover the same. The opposite electrode 230 may be in an upper portion of the display area DA and in the entire display area DA. That is, the opposite electrode 230 may be integrally formed to cover the sub-pixels PX.

The opposite electrode 230 may be a light-transmissive electrode or a reflection electrode. In some embodiments, the opposite electrode 230 may be a transparent or translucent electrode and may include a metal thin film having a low work function and including Li, Ca, LiF/Ca, LiF/Al, Al, Ag, Mg, and a compound thereof. Also, a transparent conductive oxide (TCO) layer including, for example, ITO, IZO, ZnO, or $In_2O_3$, may be further located on the metal thin film.

When the sub-pixel electrode 210 is a reflection electrode, and when the opposite electrode 230 is a light-transmissive electrode, light from the intermediate layer 220 may be irradiated towards the opposite electrode 230, and thus, the display panel 10 may be of a top emission type. In one or more other embodiments, when the sub-pixel electrode 210 is a transparent or translucent electrode and the opposite electrode 230 is a reflection electrode, light from the intermediate layer 220 may be irradiated towards the substrate 100, and thus, the display panel 10 may be of a bottom emission type. However, one or more embodiments are not limited thereto, and in some embodiments, the display panel 10 may be of a dual-emission type in which light is emitted in two directions, that is, directions towards front and rear surfaces.

The organic light-emitting diode OLED may be covered by an encapsulation member. The encapsulation member may include a thin film encapsulation layer TFE or a substrate-type encapsulation substrate, such as glass. The encapsulation member may protect the organic light-emitting diode OLED from external moisture and oxygen.

The thin film encapsulation layer TFE may include at least one organic encapsulation layer and at least one inorganic encapsulation layer. The thin film encapsulation layer TFE may entirely cover the display area DA, and may extend towards the peripheral area PA to cover part thereof.

The thin film encapsulation layer TFE may include a first inorganic encapsulation layer 310, a second inorganic encapsulation layer 330 arranged on the first inorganic encapsulation layer 310, and an organic encapsulation layer 320 arranged between the first inorganic encapsulation layer 310 and the second inorganic encapsulation layer 330.

The first inorganic encapsulation layer 310 and the second inorganic encapsulation layer 330 may each include one or more inorganic materials selected from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each be a layer or layers including one or more of the above materials. The first inorganic encapsulation layer 310 and the second inorganic encapsulation layer 330 may include the same material or different materials.

The organic encapsulation layer 320 may include a monomer-based material or a polymer-based material. The organic encapsulation layer 320 may include polyethylene terephthalate, polyethylene naphthalate, polycarbonate, polyimide, polyethylene sulfonate, polyoxymethylene, polyarylate, hexamethyldisiloxane, acrylic resin, (e.g., polymethylmethacrylate, polyacrylic acid, etc.), or an arbitrary combination thereof.

Figure 5:
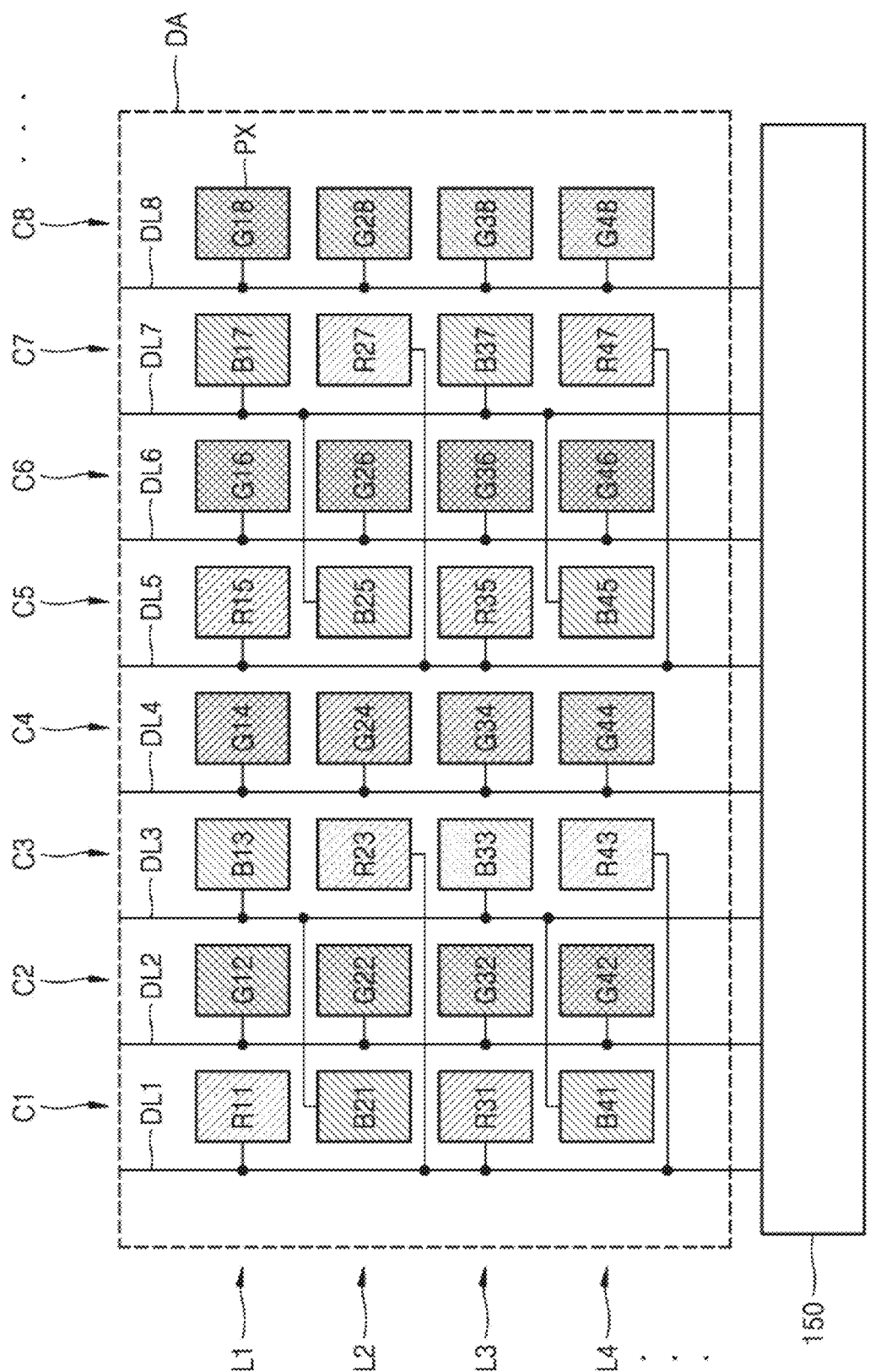
FIG. 5 is a schematic plan view of a connection structure of sub-pixels and data lines of a display apparatus, according to one or more embodiments.
Figure 6:
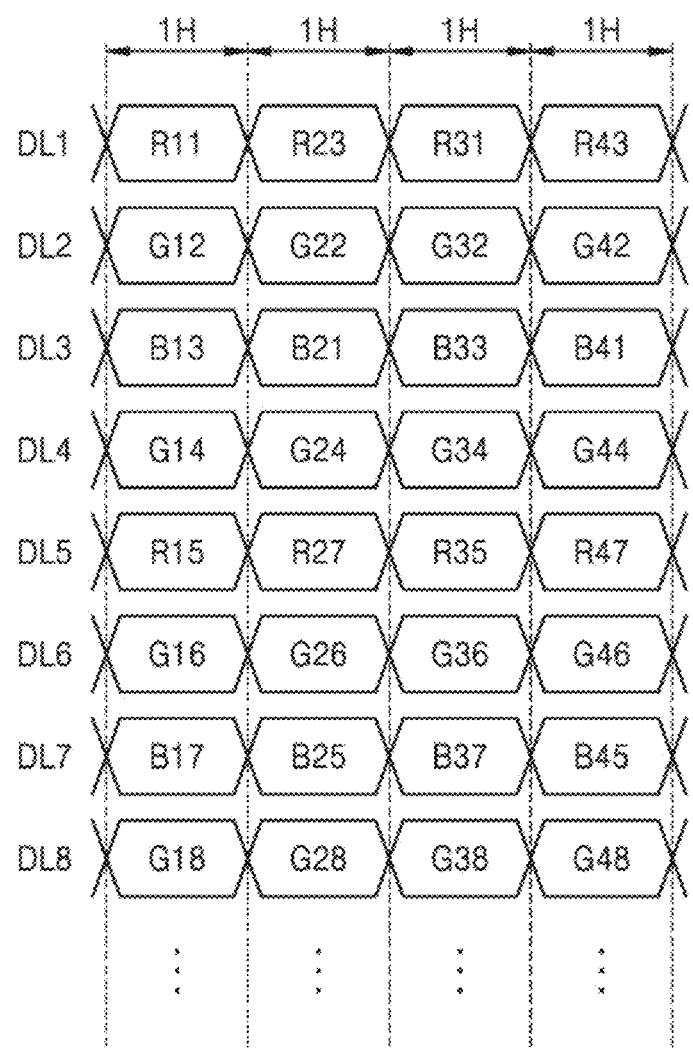
FIG. 6 is a diagram showing an example of data signals transmitted to the data lines of FIG. 5.

FIG. 5 is a schematic plan view of a connection structure of sub-pixels and data lines of a display apparatus, according to one or more embodiments, and FIG. 6 is a diagram showing an example of data signals transmitted to the data lines of FIG. 5.

Referring to FIG. 5, the display apparatus 1 may include first to eighth data lines DL1 to DL8 connected to the sub-pixels PX and the data driving circuit 150. FIG. shows the first data line DL1 to the eighth data line DL8, but one or more embodiments are not limited thereto.

The first data line DL1 to the eighth data line DL8 may respectively extend on the substrate 100 in a first direction (e.g., a y direction) and may be apart from each other.

An array of the sub-pixels PX two-dimensionally arranged in the first direction (e.g., the y direction) and the second direction (e.g., an x direction) may define the display area DA. The sub-pixels PX in the array may include a first sub-pixel of a first color, a second sub-pixel of a second color, and a third sub-pixel of a third color.

In one or more embodiments, the first sub-pixel may be a red sub-pixel R emitting red light, the second sub-pixel may be a blue sub-pixel B emitting blue light, and the third sub-pixel may be a green sub-pixel G emitting green light.

However, one or more embodiments are not limited thereto. In some embodiments, the first sub-pixel may be the blue sub-pixel B, the second sub-pixel may be the red sub-pixel R, and the third sub-pixel may be the green sub-pixel G. Alternatively, in some embodiments, the first sub-pixel, the second sub-pixel, and the third sub-pixel may respectively emit various colors of light, such as yellow.

In FIG. 5, the sub-pixels PX may include red sub-pixels R11, R15, R23, R27, R31, R35, R43, and R47, blue sub-pixels B13, B17, B21, B25, B33, B37, B41, and B45, and green sub-pixels G12, G14, G16, G18, G22, G24, G26, G28, G32, G34, G36, G38, G42, G44, G46, and G48. In the descriptions below, the reference character "R" is used for red sub-pixels, the reference character "B" is for blue sub-pixels, and the reference character "G" is for green sub-pixels.

In FIG. 5, reference characters C1, C2, C3, C4, C5, C6, C7, C8, . . . denote columns of the sub-pixels, and reference characters L1, L2, L3, L4, . . . denote rows of the sub-pixels. The first and second sub-pixels from among the first to third sub-pixels in different colors may be arranged in the same column, and the third sub-pixels may be arranged in a different column. For example, the red sub-pixels R and the blue sub-pixels B may be arranged in the same column, and the green sub-pixels G may be arranged in a different column.

In one or more embodiments, the array of the sub-pixels PX may include a first sub-pixel column C1 of the red sub-pixels R and the blue sub-pixels B, a second sub-pixel column C2 of the green sub-pixels G, a third sub-pixel column C3 of the red sub-pixels R and the blue sub-pixels B, and a fourth sub-pixel column C4 of the green sub-pixels G, and the array may have a configuration in which the first sub-pixel column C1 to the fourth sub-pixel column C4 are repeatedly arranged. For example, the fifth to eighth sub-pixel columns C5 to C8 may correspond to the configuration in which the first sub-pixel column C1 to the fourth sub-pixel column C4 are repeatedly arranged.

In each of the first sub-pixel column C1 to the third sub-pixel column C3, the red sub-pixels R and the blue sub-pixels B may be alternately arranged. The red sub-pixels R and the blue sub-pixels B, which are adjacent to each other, may be arranged apart from each other in the first direction (e.g., the y direction). The second sub-pixel column C2 may be arranged between the first sub-pixel column C1 and the third sub-pixel column C3, and the third sub-pixel column C3 may be arranged between the fourth sub-pixel column C4 and the second sub-pixel column C2. In each of the second sub-pixel column C2 and the fourth sub-pixel column C4, the green sub-pixels G may be arranged apart from each other in the first direction (e.g., the y direction).

The red sub-pixels R in the first sub-pixel column C1 and the blue sub-pixels B in the third sub-pixel column C3 may be arranged in the same row in the second direction (e.g., the x direction), which is perpendicular to the first direction (e.g., the y direction). For example, the red sub-pixel R11 in the first sub-pixel column C1 and the blue sub-pixel B13 in the third sub-pixel column C3 may be arranged in the same row.

When such a sub-pixel arrangement structure is expressed differently, it may be said that the red sub-pixels R, the blue sub-pixels B, and the green sub-pixels G are arranged in a PenTile™ type (e.g., a RGBG matrix structure, a PEN-TILE™ matrix structure, a PENTILE™ structure, or an RGBG structure, PENTILE™ being a registered trademark of Samsung Display Co., Ltd., Republic of Korea).

Referring to FIG. 5, the first sub-pixel column C1 to the eighth sub-pixel column C8 may be arranged adjacent to the first data line DL1 to the eighth data line DL8, respectively. In the present specification, the description that a sub-pixel column is adjacent to a data line may include that a sub-pixel column overlaps a data line.

The red sub-pixels R11 and R31 in the first sub-pixel column C1 may be electrically connected to the first data line DL1. The blue sub-pixels B21 and B41 in the first sub-pixel column C1 may be electrically connected to the third data line DL3.

The green sub-pixels G12, G22, G32, and G42 in the second sub-pixel column C2 may be electrically connected to the second data line DL2.

The blue sub-pixels B13 and B33 in the third sub-pixel column C3 may be electrically connected to the third data line DL3. The red sub-pixels R23 and R43 in the third sub-pixel column C3 may be electrically connected to the first data line DL1.

The green sub-pixels G14, G24, G34, and G44 in the fourth sub-pixel column C4 may be electrically connected to the fourth data line DL4.

Similarly, the red sub-pixels R15 and R35 in the fifth sub-pixel column C5 may be electrically connected to the fifth data line DL5. The blue sub-pixels B25 and B45 in the fifth sub-pixel column C5 may be electrically connected to the seventh data line DL7.

The green sub-pixels G16, G26, G36, and G46 in the sixth sub-pixel column C6 may be electrically connected to the sixth data line DL6.

The blue sub-pixels B17 and B37 in the seventh sub-pixel column C7 may be electrically connected to the seventh data line DL7. The red sub-pixels R27 and R47 in the seventh sub-pixel column C7 may be electrically connected to the fifth data line DL5.

The green sub-pixels G18, G28, G38, and G48 in the eighth sub-pixel column C8 may be electrically connected to the eighth data line DL8.

That is, sub-pixels having one color may be respectively connected to the first data line DL1 to the eighth data line DL8. For example, the red sub-pixels R may only be connected to the first data line DL1 and the fifth data line DL5. The blue sub-pixels B may only be connected to the third data line DL3 and the seventh data line DL7. The green sub-pixels G may only be connected to the second, fourth, sixth, and eighth data lines DL2, DL4, DL6, and DL8.

FIG. 6 shows data signals output from the data driving circuit 150 of FIG. 5 and transmitted through the first data line DL1 to the eighth data line DL8. The data driving circuit 150 sequentially outputs data signals to be provided to respective sub-pixels PX through data lines during one horizontal cycle 1H. Here, one horizontal cycle 1H indicates the time taken to drive sub-pixels PX arranged in the same row.

Referring to FIGS. 5 and 6, the first data line DL1 may be configured to sequentially provide data signals to the red sub-pixels R11, R23, R31, and R43. The second data line DL2 may be configured to sequentially provide data signals to the green sub-pixels G12, G22, G32, and G44. The third data line DL3 may be configured to sequentially provide data signals to the blue sub-pixels B13, B21, B33, and B41. The fourth data line DL4 may be configured to sequentially provide data signals to the green sub-pixels G14, G24, G34, and G44. That is, the first data line DL1 to the eighth data line DL8 may each be configured to continuously provide data signals in one color.

As a comparative example, when a data driving circuit alternately outputs data signals of sub-pixels in different colors, for example, red sub-pixels and blue sub-pixels, to data lines, data signals having different voltage levels are alternately output in every horizontal cycle 1H, and thus, the amount of power consumed by a display apparatus may increase.

However, according to one or more embodiments, the sub-pixels in one color may be electrically connected to each data line, and the data driving circuit 150 may respectively output data signals corresponding to one respective color to the respective data lines. Therefore, because the data signals, which are respectively provided to the data lines, have uniform voltage levels (e.g., respective uniform voltage ranges), the amount of power consumed by the display apparatus may decrease.

Figure 7:
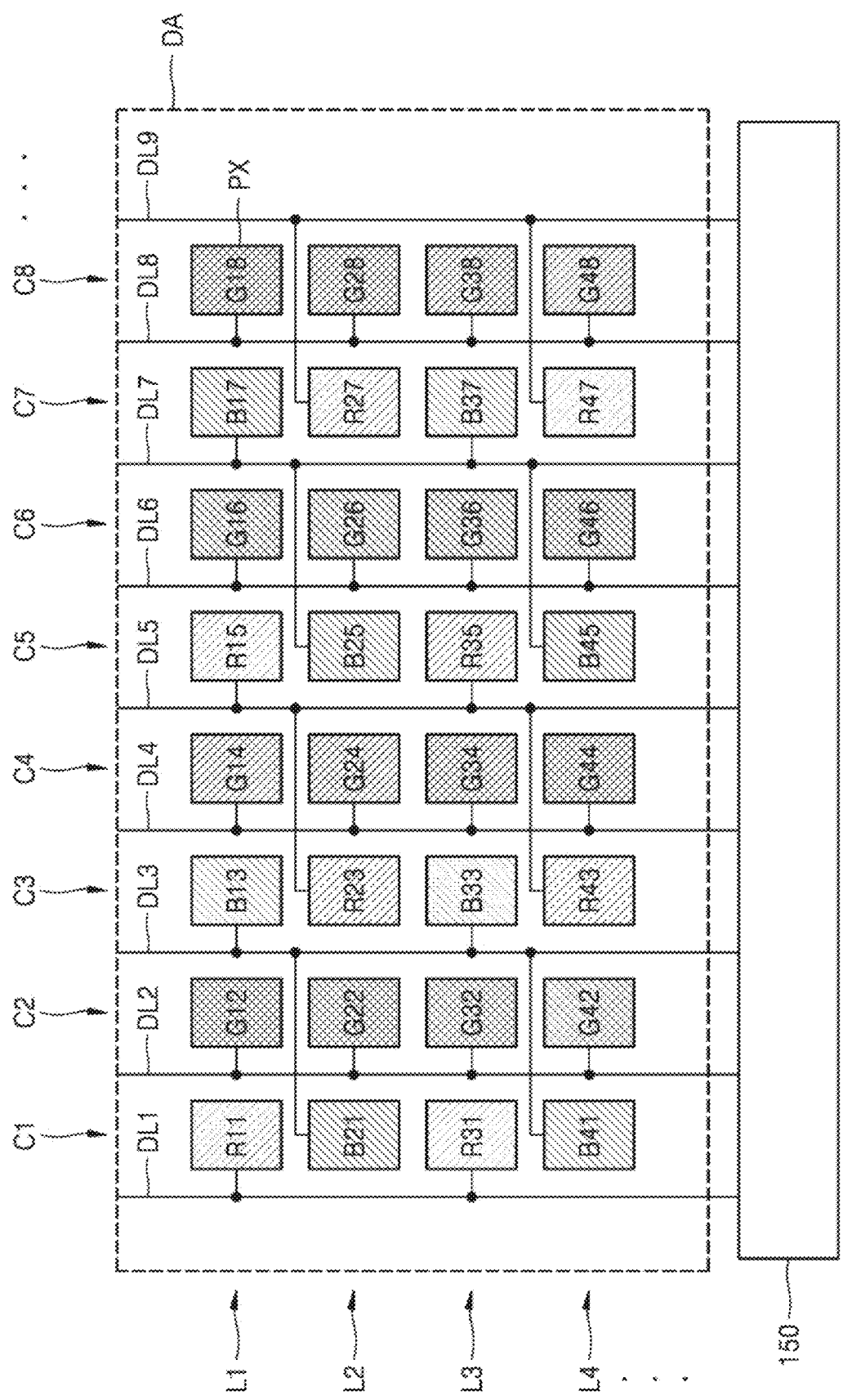
FIG. 7 is a schematic plan view of a connection structure of sub-pixels and data lines of a display apparatus, according to a comparative example.

FIG. 7 is a schematic plan view of a connection structure of sub-pixels and data lines of a display panel, according to a comparative example. The one or more embodiments corresponding to FIG. 7 may be different from that of FIG. 5 in terms of the structure in which the sub-pixels PX in the first sub-pixel column C1, the third sub-pixel column C3, the fifth sub-pixel column C5, and the seventh sub-pixel column C7 are connected to the data lines.

Referring to FIG. 7, the red sub-pixels R11 and R31 in the first sub-pixel column C1 may be electrically connected to the first data line DL1, and the blue sub-pixels B21 and B41 in the first sub-pixel column C1 may be electrically connected to the third data line DL3.

The red sub-pixels R23 and R43 in the third sub-pixel column C3 may be electrically connected to the fifth data line DL5, and the blue sub-pixels B13 and B33 in the third sub-pixel column C3 may be electrically connected to the third data line DL3.

Similarly, the red sub-pixels R15 and R35 in the fifth sub-pixel column C5 may be electrically connected to the fifth data line DL5, and the blue sub-pixels B25 and B45 in the fifth sub-pixel column C5 may be electrically connected to the seventh data line DL7.

The blue sub-pixels B17 and B37 in the seventh sub-pixel column C7 may be electrically connected to the seventh data line DL7, and the red sub-pixels R27 and R47 in the seventh sub-pixel column C7 may be electrically connected to the ninth data line DL9.

In the connection structure of the data lines and the sub-pixels according to the comparative example of FIG. 7, each data line may be electrically connected to the sub-pixels in one color, and the data driving circuit may output the data signals in one color to each data line. Unlike the illustration of FIG. 5, however, FIG. 7 may additionally show a ninth data line DL9 configured to provide red data signals to the red sub-pixels R27 and R47 in the seventh sub-pixel column C7. Therefore, a configuration of the data driving circuit 150 configured to output a data signal to the ninth data line DL9 may be added, and thus, an area of the data driving circuit 150 may increase. That is, the dead space in the display apparatus 1 may increase.

However, referring to FIGS. 5 and 7, one or more embodiments of the disclosure shows, for example, a cross-connection structure in which the red sub-pixels R11 and R31 in the first sub-pixel column C1 are electrically connected to the third data line DL3 corresponding to the third sub-pixel column C3, and in which the blue sub-pixels B13 and B33 in the third sub-pixel column C3 are electrically connected to the first data line DL1 corresponding to the first sub-pixel column C1, and thus, a structure, in which the data driving circuit 150 provides data signals in one color to each data line, may be realized without adding a data line other than the first data line DL1 to the eighth data line DL8. Therefore, the dead space in the display apparatus 1 may not expand.

Figure 8:
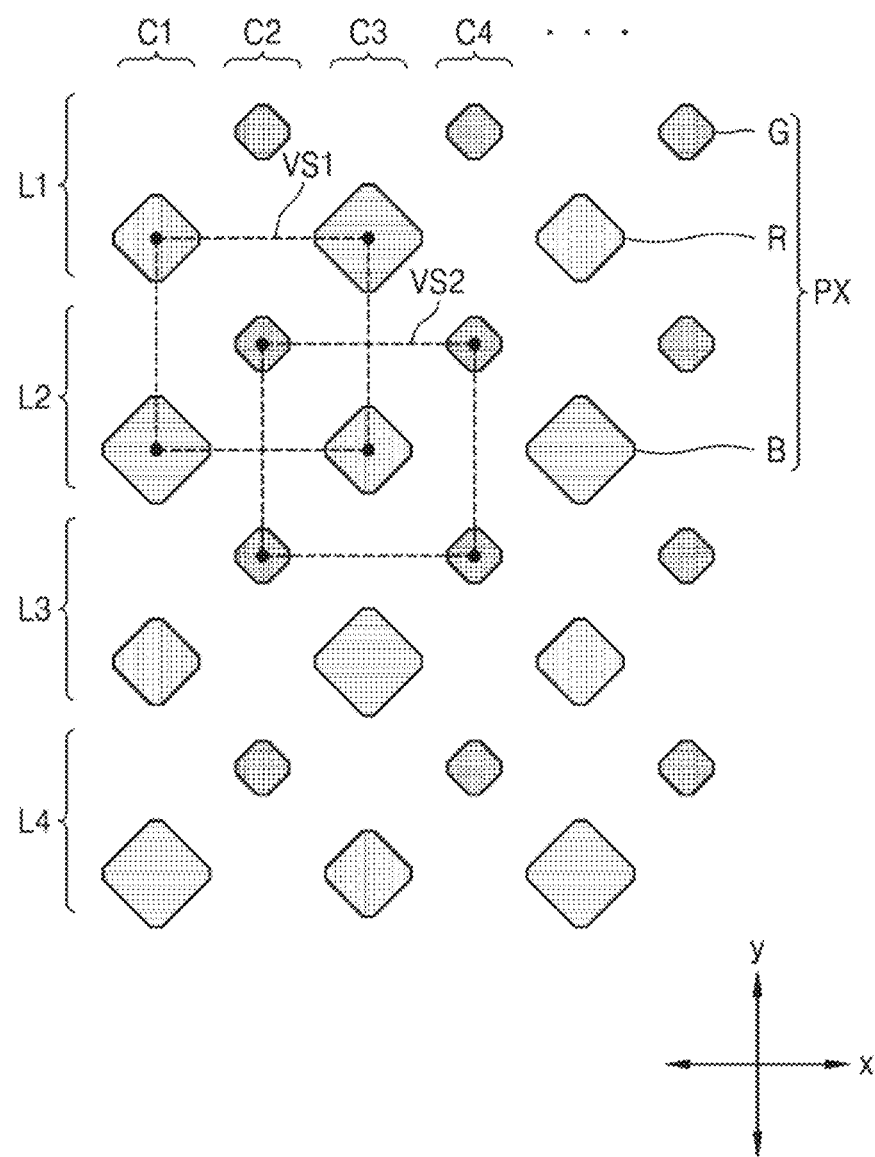
FIG. 8 is a plan view of an array of sub-pixels of a display panel, according to one or more embodiments.

FIG. 8 is a plan view of an array of sub-pixels of a display panel, according to one or more embodiments.

Referring to FIG. 8, the sub-pixels PX in the array may include first sub-pixels of a first color, second sub-pixels of a second color, and third sub-pixels of a third color. In one or more embodiments, the first sub-pixel may be a red sub-pixel R, the second sub-pixel may be the blue sub-pixel B, and the third sub-pixel may be the green sub-pixel G.

In one or more embodiments, the red sub-pixel R, the blue sub-pixel B, and the green sub-pixel G may be arranged in a diamond PenTile™ type among the PenTile™ types.

In this case, in the sub-pixel arrangement structure of FIG. 5, the green sub-pixels G in a first sub-pixel row L1 may be arranged in a direction diagonal to, or offset from, the red sub-pixel R or the blue sub-pixel B in the same row, wherein the diagonal direction crosses the first direction (e.g., the y direction) and the second direction (e.g., the x direction).

In other words, it may be said that the red sub-pixels R are arranged on a first vertex and a third vertex, which are arranged diagonally to each other from among vertices of a first virtual square VS1 having a center of a green sub-pixel G as a center point of the first virtual square VS1, and the blue sub-pixels B are arranged on a second vertex and a fourth vertex that are the other vertices of the first virtual square VS1.

When the above sub-pixel arrangement structure is differently expressed, it may be said that the green sub-pixels G are respectively located on vertices of a second virtual square VS2 having a center of a red sub-pixel R or of a blue sub-pixel B as a center point of the second virtual square VS2. The shapes of first and second virtual squares VS1 and VS2 may vary, for example, a rectangle, a rhombus, and the like.

In one or more embodiments, sizes (or widths) of the red sub-pixel R and the blue sub-pixel B may be greater than a size (or a width) of the green sub-pixel G. The size (or the width) of the blue sub-pixel B may be identical to, or different from, that of the red sub-pixel R.

Figure 9:
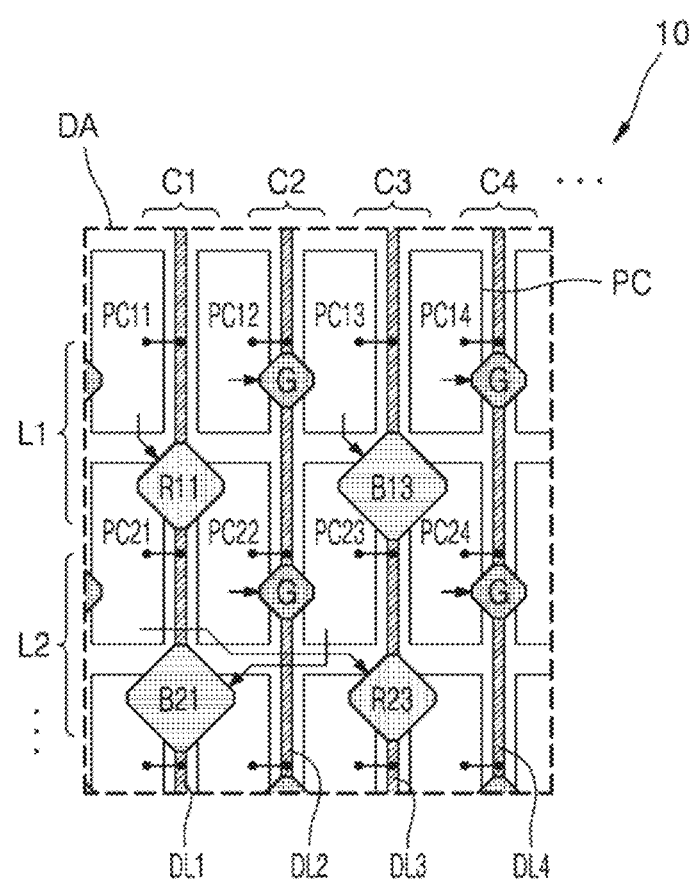
FIG. 9 is a schematic plan view of a portion of a display panel, according to one or more embodiments.
Figure 10:
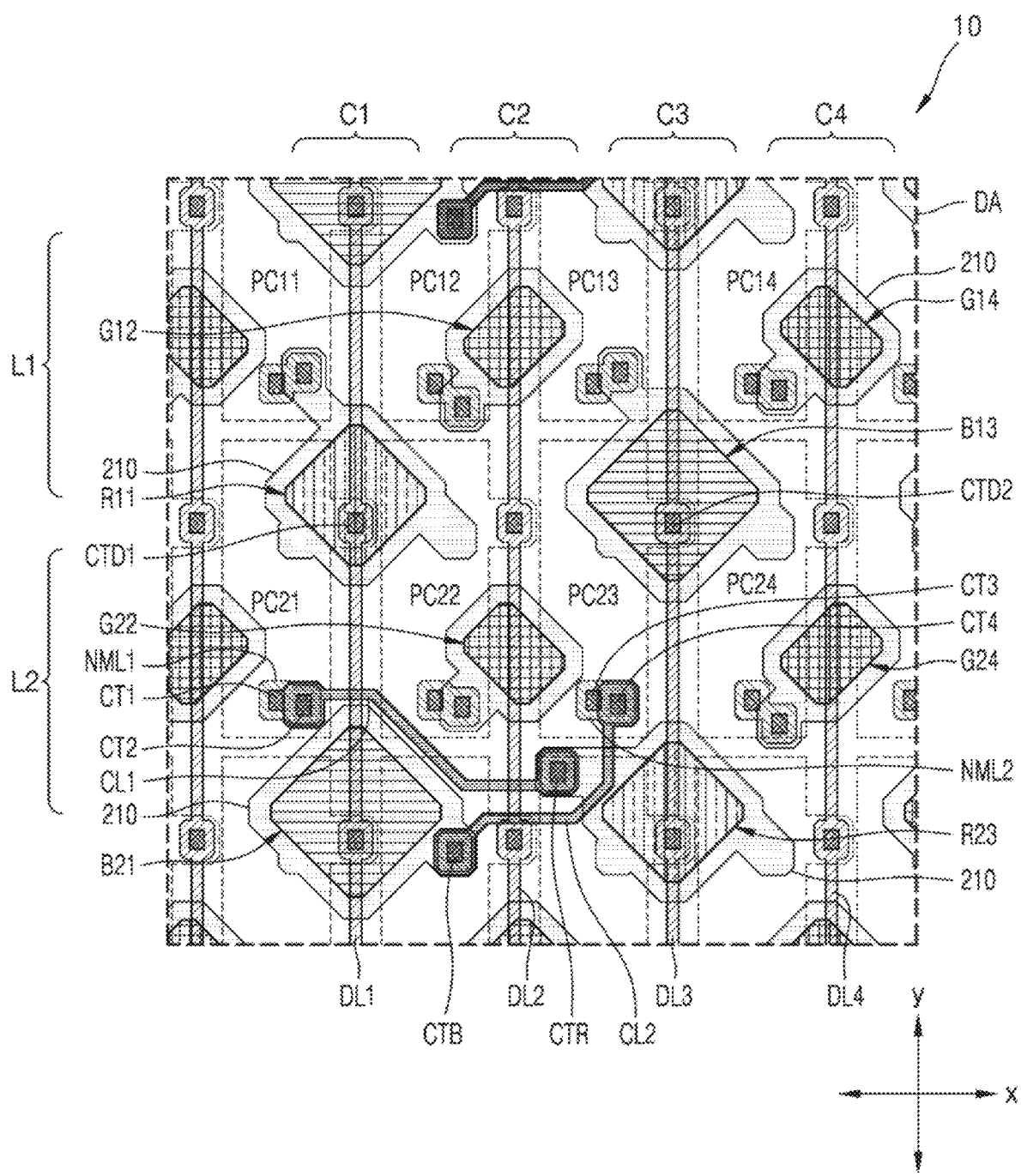
FIG. 10 is a schematic plan view of a portion of a display panel, according to one or more embodiments.

FIGS. 9 and 10 each are a schematic plan view of a portion of a display panel, according to one or more embodiments. FIG. 10 is a plan view showing the display panel of FIG. 9 in more detail.

Referring to FIGS. 9 and 10, the data lines DL1 to DL4, the sub-pixels PX, and the sub-pixel circuits PC may be arranged in the display area DA of the display panel 10.

The sub-pixels PX may include first sub-pixels of a first color, second sub-pixels of a second color, and third sub-pixels of a third color. In one or more embodiments, the first sub-pixel may be a red sub-pixel R, the second sub-pixel may be a blue sub-pixel B, and the third sub-pixel may be a green sub-pixel G. For example, the sub-pixels PX may include red sub-pixels R11 and R23, blue sub-pixels B13 and B21, and green sub-pixels G/G12, G14, G22, and G24.

An array of the sub-pixels PX may include a first sub-pixel column C1, in which some of the red sub-pixels R and the blue sub-pixels B are alternately arranged, a second sub-pixel column C2, in which some of the green sub-pixels G are arranged apart from each other, a third sub-pixel column C3, in which others of the red sub-pixels R and the blue sub-pixels B are alternately arranged, and a fourth sub-pixel column C4, in which others of the green sub-pixels G are arranged apart from each other, and the array may include a configuration in which the first sub-pixel column C1 to the fourth sub-pixel column C4 are repeatedly arranged. In one or more embodiments, the array of the sub-pixels PX may be the same as the array of the sub-pixels PX described with reference to FIG. 8. For example, the red sub-pixel R, the blue sub-pixel B, and the green sub-pixel G may be arranged in a diamond PenTile™ type.

The first sub-pixel may include a first light-emitting diode for emitting light of a first color. The second sub-pixel may include a second light-emitting diode for emitting light of a second color. The third sub-pixel may include a second light-emitting diode for emitting light of a third color. In one or more embodiments, the first light-emitting diode may be a red light-emitting diode, the second light-emitting diode may be a blue light-emitting diode, and the third light-emitting diode may be a green light-emitting diode.

In the display area DA, the arrangement of the red, green, and blue light-emitting diodes may be substantially the same as the arrangement of the red, blue, and green sub-pixels R, B, and G.

Referring to FIGS. 9 and 10, in one or more embodiments, the first sub-pixel column C1 to the fourth sub-pixel column C4 may respectively overlap the first data line DL1 to the fourth data line DL4. For example, the red sub-pixel R and the blue sub-pixel B in the first sub-pixel column C1 may overlap the first data line DL1. The green sub-pixels G in the second sub-pixel column C2 may overlap the second data line DL2. The red sub-pixel R and the blue sub-pixel B in the third sub-pixel column C3 may overlap the third data line DL3. The green sub-pixels G in the fourth sub-pixel column C4 may overlap the fourth data line DL4.

The sub-pixel circuits PC may be arranged to form columns and rows, corresponding to the sub-pixels PX. The sub-pixel circuits PC may be arranged at regular intervals in the first direction (e.g., the y direction) and the second direction (e.g., the x direction). For example, the sub-pixel circuits PC may include a 1-1 sub-pixel circuit PC11 and a 2-1 sub-pixel circuit PC21 in a first column, a 1-2 sub-pixel circuit PC12 and a 2-2 sub-pixel circuit PC22 in a second column, a 1-3 sub-pixel circuit PC13 and a 2-3 sub-pixel circuit PC23 in a third column, and a 1-4 sub-pixel circuit PC14 and a 2-4 sub-pixel circuit PC24 in a fourth column.

The 1-1 sub-pixel circuit PC11 and the 2-1 sub-pixel circuit PC21 in the first column may be adjacent to the first sub-pixel column C1 and may be electrically connected to the first data line DL1. The 1-2 sub-pixel circuit PC12 and a 2-2 sub-pixel circuit PC22 in the second column may be adjacent to the second sub-pixel column C2 and may be electrically connected to the second data line DL2. The 1-3 sub-pixel circuit PC13 and a 2-3 sub-pixel circuit PC23 in the third column may be adjacent to the third sub-pixel column C3 and may be electrically connected to the third data line DL3. The 1-4 sub-pixel circuit PC14 and a 2-4 sub-pixel circuit PC24 in the fourth column may be adjacent to the fourth sub-pixel column C4 and may be electrically connected to the fourth data line DL4.

The red light-emitting diode corresponding to the red sub-pixel R11 in the first sub-pixel column C1 may be electrically connected to the 1-1 sub-pixel circuit PC11 in the first column that is electrically connected to the first data line DL1.

The blue light-emitting diode corresponding to the blue sub-pixel B21 in the first sub-pixel column C1 may be electrically connected to the 2-3 sub-pixel circuit PC23 in the third column that is electrically connected to the third data line DL3.

The green light-emitting diodes corresponding to the green sub-pixels G12 and G22 in the second sub-pixel column C2 may be electrically connected to the 1-2 and 2-2 sub-pixel circuits PC12 and PC22 in the second column that are electrically connected to the second data line DL2.

The blue light-emitting diode corresponding to the blue sub-pixel B13 in the third sub-pixel column C3 may be electrically connected to the 1-3 sub-pixel circuit PC13 in the third column that is electrically connected to the third data line DL3.

The red light-emitting diode corresponding to the red sub-pixel R23 in the third sub-pixel column C3 may be electrically connected to the 2-1 sub-pixel circuit PC21 in the first column that is electrically connected to the first data line DL1.

The green light-emitting diodes corresponding to the green sub-pixels G14 and G24 in the fourth sub-pixel column C4 may be electrically connected to the 1-4 and 2-4 sub-pixel circuits PC14 and PC24 in the fourth column that are electrically connected to the fourth data line DL4.

The first data line DL1 to the fourth data line DL4 may be electrically connected to the sub-pixels in one color, respectively. For example, the first data line DL1 may be electrically connected to the red sub-pixels R, the second data line DL2 may be electrically connected to the green sub-pixels G, the third data line DL3 may be electrically connected to the blue sub-pixels B, and the fourth data line DL4 may be electrically connected to the green sub-pixels G. Therefore, the first data line DL1 to the fourth data line DL4 may respectively provide data signals in one corresponding color.

FIG. 10 shows a detailed connection structure of the sub-pixels PX, the sub-pixel circuits PC, and the first to fourth data lines DL1 to DL4 of FIG. 9. The red light-emitting diode corresponding to the red sub-pixel R, the blue light-emitting diode corresponding to the blue sub-pixel B, and the green light-emitting diode corresponding to the green sub-pixel G may each include the sub-pixel electrode 210, the intermediate layer 220 (of FIG. 4), and the opposite electrode 230 (of FIG. 4).

Each of the 1-1 sub-pixel circuit PC11 and the 2-1 sub-pixel circuit PC21 may be electrically connected to the first data line DL1 through a contact hole. Each of the 1-2 sub-pixel circuit PC12 and the 2-2 sub-pixel circuit PC22 may be electrically connected to the second data line DL2 through a contact hole. Each of the 1-3 sub-pixel circuit PC13 and the 2-3 sub-pixel circuit PC23 may be electrically connected to the third data line DL3 through a contact hole. Each of the 1-4 sub-pixel circuit PC14 and the 2-4 sub-pixel circuit PC24 may be electrically connected to the fourth data line DL4 through a contact hole. For example, the 2-1 sub-pixel circuit PC21 may be electrically connected to the first data line DL1 through a first line contact hole CTD1, and the 2-3 sub-pixel circuit PC23 may be electrically connected to the third data line DL3 through a second line contact hole CTD2.

The sub-pixel electrode 210 of the red light-emitting diode corresponding to the red sub-pixel R23 in the third sub-pixel column C3 may be electrically connected to a first connection line CL1 through a sub-pixel contact hole CTR. The first connection line CL1 may be electrically connected to a first connection member NML1 through a second contact hole CT2, and the first connection member NML1 may be electrically connected to the 2-1 sub-pixel circuit PC21 in the first column through a first contact hole CT1.

The sub-pixel electrode 210 of the blue light-emitting diode corresponding to the blue sub-pixel B21 in the first sub-pixel column C1 may be electrically connected to the second connection line CL2 through a sub-pixel contact hole CTB. The second connection line CL2 may be electrically connected to a second connection member NML2 through a fourth contact hole CT4, and the second connection member NML2 may be electrically connected to the 2-3 sub-pixel circuit PC23 in the third column through a third contact hole CT3.

In one or more embodiments, the first connection line CL1 and the second connection line CL2 may each cross the second data line DL2.

In one or more embodiments, the first connection line CL1 and the second connection line CL2 may each include a conductor or a doped semiconductor material. The first connection line CL1 and the second connection line CL2 may each include, for example, Al, Pt, Pd, Ag, Mg, Au, Ni, Nd, Ir, Cr, Ca, Mo, Ti, W, and/or Cu and may have a single-layer structure or a multilayered structure including one or more of the above materials. Alternatively, the first connection line CL1 and the second connection line CL2 may include, for example, Transparent Conducting Oxide (TCO), such as ITO or IZO.

In one or more embodiments, as shown in FIG. 10, the first connection line CL1 and the second connection line CL2 may be separated from the sub-pixel electrode 210. However, one or more embodiments are not limited thereto. In some embodiments, the first connection line CL1 and/or the second connection line CL2 may be formed integrally with the sub-pixel electrode 210.

Figure 11:
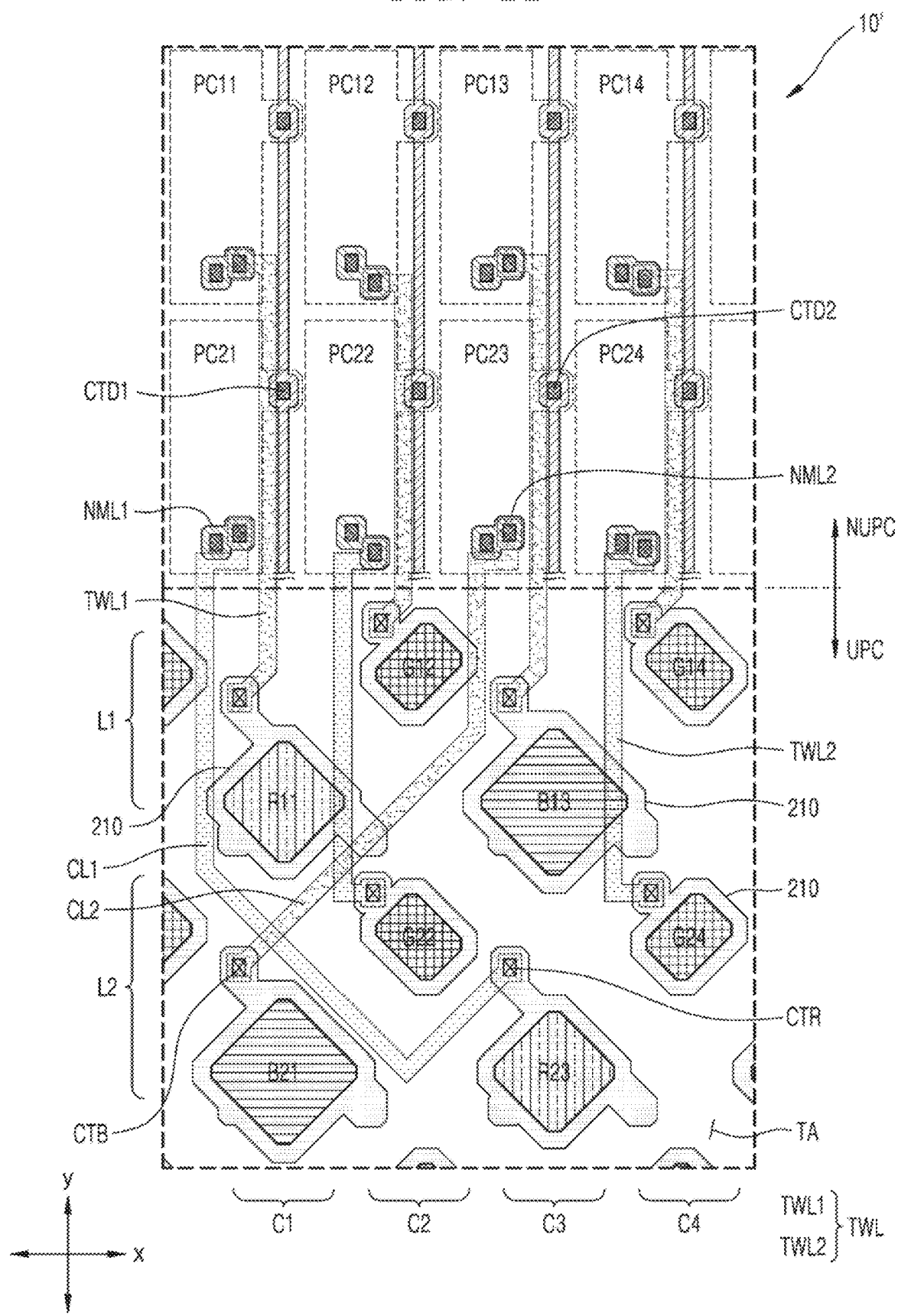
FIG. 11 is a schematic plan view of a portion of a display panel, according to one or more other embodiments.
Figure 12:
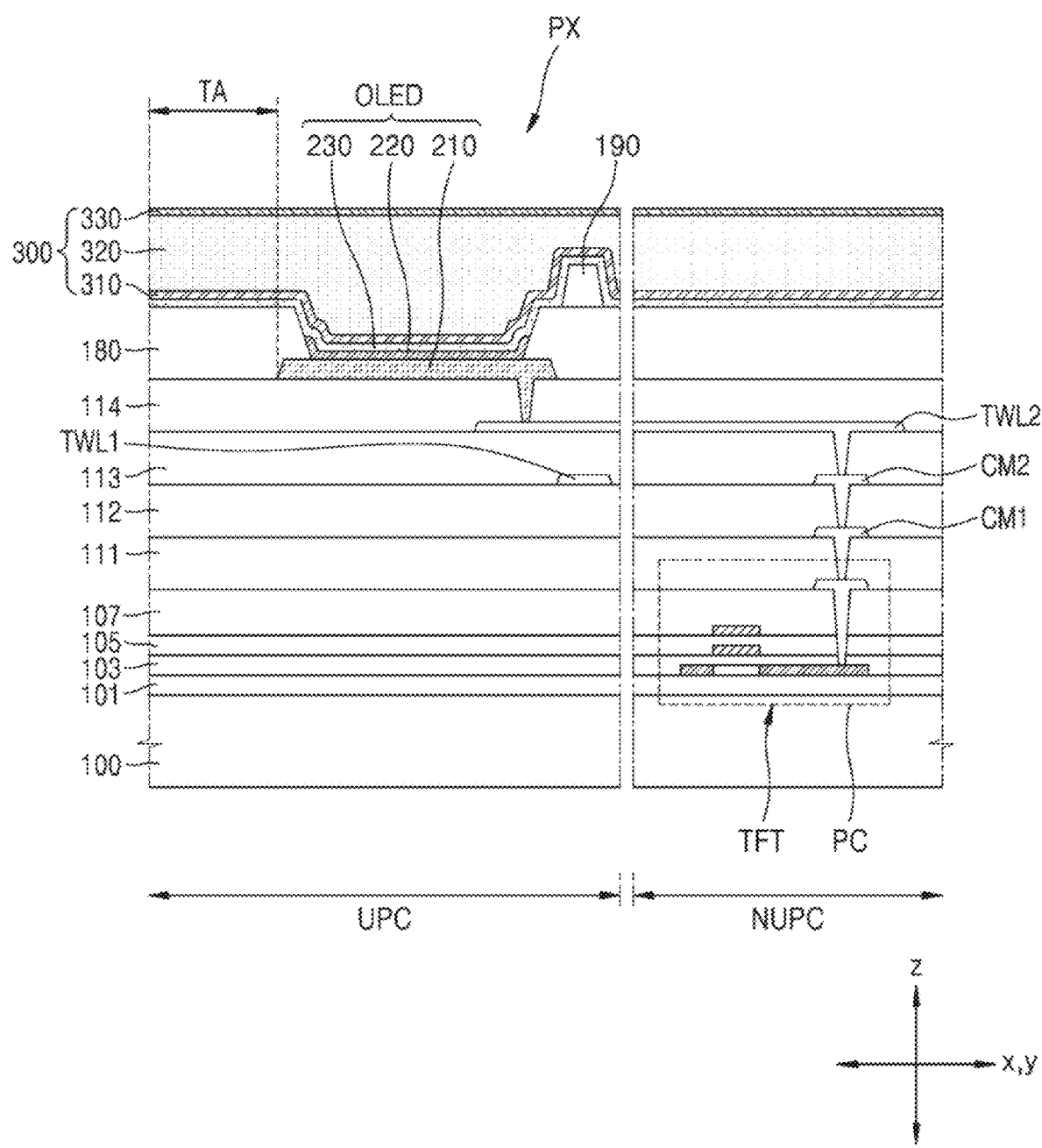
FIG. 12 is a schematic cross-sectional view of a portion of a display panel, according to one or more other embodiments.

FIG. 11 is a schematic plan view of a portion of a display panel, according to one or more other embodiments, and FIG. 12 is a schematic plan view of a portion of the display panel of FIG. 11.

FIG. 10 shows that the sub-pixel circuits PC and the light-emitting diodes are in the same area, but as shown in FIGS. 11 and 12, in one or more other embodiments, the sub-pixel circuits PC may be in a different area from the light-emitting diodes. Because the arrangement of the sub-pixel circuits PC and the arrangement of the light-emitting diodes are the same as those described with reference to FIG. 10, the difference therebetween is mainly described below.

Referring to FIG. 11, in a display panel 10', some light-emitting diodes may be arranged in a non-UPC area NUPC, and the sub-pixel circuits PC electrically connected to the light-emitting diodes may be arranged in a UPC area UPC.

In one or more embodiments, the first data line DL1 to the fourth data line DL4 may be arranged in the non-UPC area NU PC and may not extend to the UPC area UPC.

In one or more embodiments, light-emitting diodes OLED in the UPC area UPC may be electrically connected to the sub-pixel circuits PC in the non-UPC area NUPC through a corresponding transparent conductive line TWL extending from the non-UPC area NUPC to the UPC area UPC. For example, the transparent conductive line TWL may extend in the first direction (e.g., the y direction). The transparent conductive line TWL may include a transparent conductive material. The transparent conductive material may include TCO. The TCO may include conducting oxide, such as ITO, IZO, ZnO, In$_2$O$_3$, IGO, IZGO, or AZO. Therefore, the degradation in light transmittance in the UPC area UPC may decrease. In one or more embodiments, the transparent conductive line TWL may include a first transparent conductive line TWL1 and/or a second transparent conductive line TWL2.

For example, the sub-pixel electrode 210 of the red light-emitting diode corresponding to the red sub-pixel R11 in the UPC area UPC may be electrically connected to the 1-1 sub-pixel circuit PC11 in the non-UPC area NUPC through the first transparent conductive line TWL1 and a contact hole.

The sub-pixel electrode 210 of the green light-emitting diode corresponding to the green sub-pixel G24 in the UPC area UPC may be electrically connected to the 2-4 sub-pixel circuit PC24 in the non-UPC area NUPC through the second transparent conductive line TWL2 and a contact hole.

For example, the sub-pixel electrode 210 of the red light-emitting diode corresponding to the red sub-pixel R23 in the UPC area UPC may be electrically connected to the first connection line CL1 through the sub-pixel contact hole CTR. The first connection line CL1 may be electrically connected to the 2-1 sub-pixel circuit PC21 in the non-UPC area NUPC through the first connection member NML1 and corresponding contact holes.

The sub-pixel electrode 210 of the blue light-emitting diode corresponding to the blue sub-pixel B21 in the UPC area UPC may be electrically connected to the second connection line CL2 through the sub-pixel contact hole CTB. The second connection line CL2 may be electrically connected to the 2-3 sub-pixel circuit PC23 in the non-UPC area NUPC through the second connection member NML2 and corresponding contact holes.

In one or more embodiments, the first connection line CL1 and the second connection line CL2 may each be formed through the same process as the transparent conductive line TWL (e.g., the first transparent conductive line TWL1 or the second transparent conductive line TWL2), and may include the same material.

FIG. 12 shows a cross-sectional structure in which the light-emitting diode OLED in the UPC area UPC is electrically connected to the sub-pixel circuit PC in the non-UPC area NUPC, as an example. The light-emitting diode OLED of FIG. 12 may correspond to the red light-emitting diode, the blue light-emitting diode, or the green light-emitting diode, which respectively correspond to the red sub-pixel R, the blue sub-pixel B, or the green sub-pixel G of FIG. 11. As described above with reference to FIG. 4, the sub-pixel circuit PC may include a plurality of thin film transistors and a storage capacitor. FIG. 12 shows the thin film transistor TFT of the sub-pixel circuit PC. On the substrate 100, the buffer layer 101, the gate insulating layer 103, the first interlayer insulating layer 105, the second interlayer insulating layer 107, and the first to fourth planarization layers 111 to 114 may be arranged.

In one or more embodiments, the second transparent conductive line TWL2 may be electrically connected to the thin film transistor TFT of the sub-pixel circuit PC through the first and second connection electrodes CM1 and CM2. The first connection electrode CM1 may be formed on the same layer, and may include the same material as the connection electrode CM (of FIG. 4).

The third planarization layer 113 may be arranged on the first connection electrode CM1. The second connection electrode CM2 may be arranged on the second planarization layer 112. The second connection electrode CM2 may contact the first connection electrode CM1 through a contact hole in the second planarization layer 112. Also, the first transparent conductive line TWL1 may be arranged on the second planarization layer 112. The third planarization layer 113 may be arranged to cover the second connection electrode CM2 and the first transparent conductive line TWL1. The second transparent conductive line TWL2 may be arranged on the third planarization layer 113. The fourth planarization layer 114 may be arranged to cover the second transparent conductive line TWL2.

The third planarization layer 113 and the fourth planarization layer 114 may each include an inorganic insulating material and/or an organic insulating material. The third planarization layer 113 and the fourth planarization layer 114 may each include, for example, an inorganic insulating material, such as silicon oxide, silicon oxynitride, or silicon nitride. The third planarization layer 113 and the fourth planarization layer 114 may each include, for example, an organic insulating material, such as acryl, BCB, polyimide, or HMDSO.

The second transparent conductive line TWL2 may contact the sub-pixel electrode 210 of the light-emitting diode OLED through a contact hole in the fourth planarization layer 114. In one or more embodiments, FIG. 12 shows that the sub-pixel electrode 210 of the light-emitting diode OLED is electrically connected to the second transparent conductive line TWL2 through the contact hole in the fourth planarization layer 114, but one or more embodiments are not limited thereto.

On the sub-pixel electrode 210 of the light-emitting diode OLED, the bank layer 180 having/defining an opening overlapping the sub-pixel electrode 210 and the spacer 190 may be arranged. The sub-pixel electrode 210, the intermediate layer 220, the opposite electrode 230, and the encapsulation layer 300 may be arranged as described above with reference to FIG. 4.

In one or more embodiments, the UPC area UPC may be a portion of the display area DA, and the non-UPC area NUPC may be another portion of the display area DA or the peripheral area PA, which surrounds the UPC area UPC.

Figure 13:
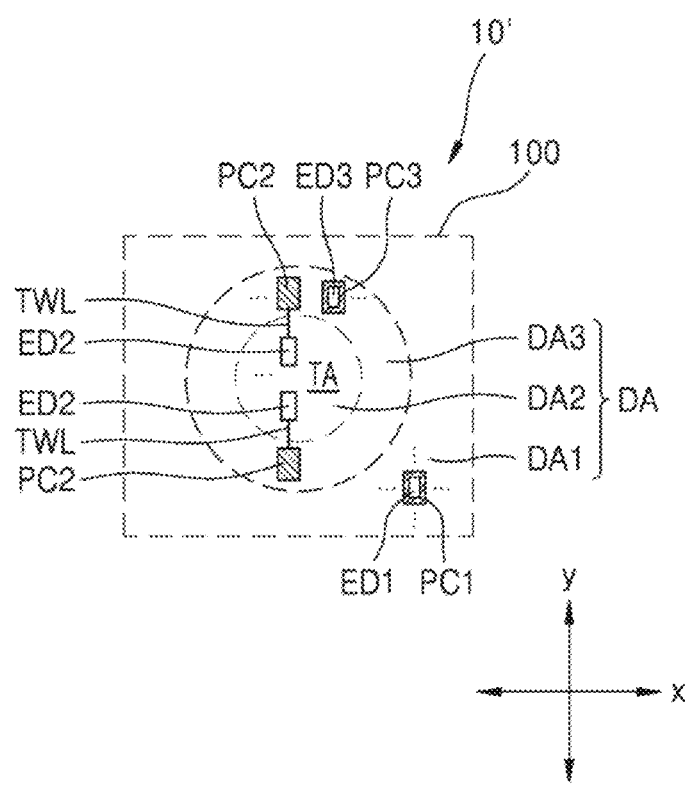
FIG. 13 is a schematic plan view of a portion of a display apparatus, according to one or more other embodiments.

FIG. 13 is a schematic plan view of a portion of a display apparatus, according to one or more other embodiments. In one or more embodiments, FIG. 13 is a plan view showing that the UPC area UPC is a portion of the display area DA, and the non-UPC area NUPC is another portion of the display area DA that surrounds the UPC area UPC.

Referring to FIG. 13, the display area DA of the display panel 10' may include first, second, and third display areas DA1, DA2, and DA3. Light-emitting diodes are arranged in the first, second, and third display areas DA1, DA2, and DA3, and sub-pixel circuits electrically connected to the light-emitting diodes are arranged in the first and third display areas DA1 and DA3, but are not arranged in the second display area DA2. For example, first sub-pixel circuits PC1 electrically connected to first light-emitting diodes ED1 in the first display area DA1 may be arranged in the first display area DA1, and second and third sub-pixel circuits PC2 and PC3 electrically connected to second and third light-emitting diodes ED2 and ED3 in the second and third display areas DA2 and DA3 may be arranged in the third display area DA3. In other words, some of the sub-pixel circuits (e.g., the second sub-pixel circuit PC2) arranged in the third display area DA3 may be electrically connected to the second light-emitting diodes ED2 arranged in the second display area DA2, and others thereof (e.g., the third sub-pixel circuit PC3) may be electrically connected to the third light-emitting diodes ED3 arranged in the third display area DA3. Hereinafter, for convenience of explanation, the sub-pixel circuits, which are electrically connected to the second light-emitting diodes ED2 from among the sub-pixel circuits arranged in the third display area DA3, may be referred to as the second sub-pixel circuits PC2, and the sub-pixel circuits, which are electrically connected to the third light-emitting diodes ED3 from among the sub-pixel circuits arranged in the third display area DA3, may be referred to as the third sub-pixel circuits PC3.

The first light-emitting diode ED1 is arranged in the first display area DA1. Light emitted from the first light-emitting diode ED1 may correspond to light from the first sub-pixel, and the location of the first light-emitting diode ED1 may be the location of the first sub-pixel. The first light-emitting diode ED1 may emit, for example, red light, green light, or blue light. The first sub-pixel circuit PC1 driving the first light-emitting diode ED1 may be in the first display area DA1, and may be electrically connected to the first light-emitting diode ED1.

The second light-emitting diode ED2 is in the second display area DA2. Light emitted from the second light-emitting diode ED2 may correspond to light from the second sub-pixel, and the location of the second light-emitting diode ED2 may be the location of the second sub-pixel. The second light-emitting diode ED2 may emit, for example, red light, green light, or blue light.

A transmission area TA may be between the second light-emitting diodes ED2. In one or more embodiments, a portion of the second display area DA2 in which no second light-emitting diodes ED2 are arranged may correspond to the transmission area TA. To increase an area of the transmission area TA and to improve the transmittance, the second sub-pixel circuit PC2 for driving the second light-emitting diodes ED2 may be arranged in the third display area DA3 that is on an outer side of the second display area DA2. Some of the second sub-pixel circuits PC2 may be in some portions of the third display area DA3 that is adjacent to an upper side of the second display area DA2, and the others thereof may be in some portions of the third display area DA3 that is adjacent to a lower side of the second display area DA2.

The second sub-pixel circuits PC2 in the third display area DA3 may be electrically connected to the second light-emitting diode ED2 in the second display area DA2 through the transparent conductive line TWL. The second light-emitting diode ED2 may be electrically connected to the second sub-pixel circuit PC2 in the first direction (e.g., the y direction).

The third light-emitting diode ED3 is arranged in the third display area DA3. The light from the third light-emitting diode ED3 may correspond to light from the third sub-pixel, and the location of the third light-emitting diode ED3 may be the location of the third sub-pixel. The third light-emitting diode ED3 may emit, for example, red light, green light, or blue light.

The third sub-pixel circuit PC3 for driving the third light-emitting diode ED3 is arranged in the third display area DA3. The third sub-pixel circuit PC3 may be electrically connected to the third light-emitting diode ED3 and may drive the same.

In one or more embodiments, the UPC area UPC of FIGS. 11 and 12 may be the second display area DA2 of FIG. 13, and the non-UPC area NUPC of FIGS. 11 and 12 may be the third display area DA3 of FIG. 13. The light-emitting diode OLED of FIG. 12 may correspond to the second light-emitting diode ED2 in the second display area DA2, and the sub-pixel circuit PC electrically connected to the light-emitting diode OLED of FIG. 12 may correspond to the second sub-pixel circuit PC2.

Figure 14:
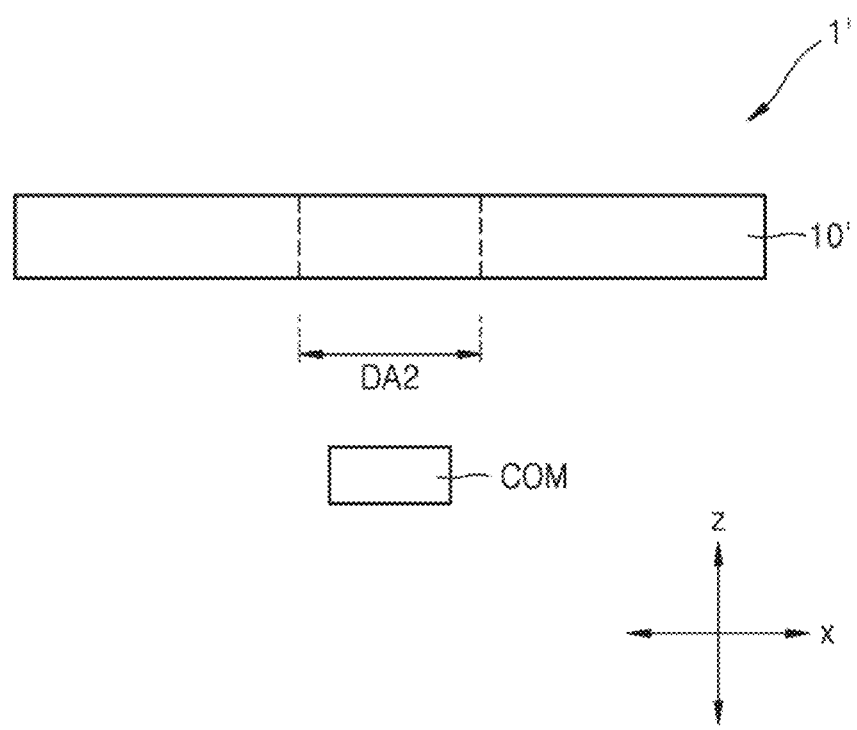
FIG. 14 is a schematic cross-sectional view of a display apparatus, according to one or more other embodiments.

FIG. 14 is a schematic cross-sectional view of a display apparatus, according to one or more other embodiments, and shows a display apparatus 1' including the display panel 10' of FIG. 13.

Referring to FIG. 14, the display apparatus 1' may include the display panel and a component COM under the display panel 10'.

The display apparatus 1' may include the display panel 10' and the component COM overlapping the display panel 10'. The component COM may be in the second display area DA2.

The component COM may be an electronic component using light or sound. For example, the electronic component may be a sensor (e.g., a proximity sensor, which measures a distance, a sensor for recognizing a body part of a user (e.g., fingerprints, an iris, faces, etc.), a small lamp for outputting light, an image sensor (e.g., a camera) for capturing images, or the like). An electronic component using light may use light in various wavelength bands, for example, visible rays, infrared rays, ultraviolet rays, and the like. An electronic component using sound may use ultrasound or light in a different frequency band.

The second display area DA2 may include the transmission area TA, through which light and/or sound from the component COM to the outside, or from the outside to the component COM, may penetrate. In the case of the display apparatus 1' according to one or more embodiments, when light penetrates through the second display area DA2 including the transmission area TA, the light transmittance may be equal to or greater than about 10%, more preferably, about 25%, about 40%, about 50%, about 85%, or about 90%.

Figure 15:
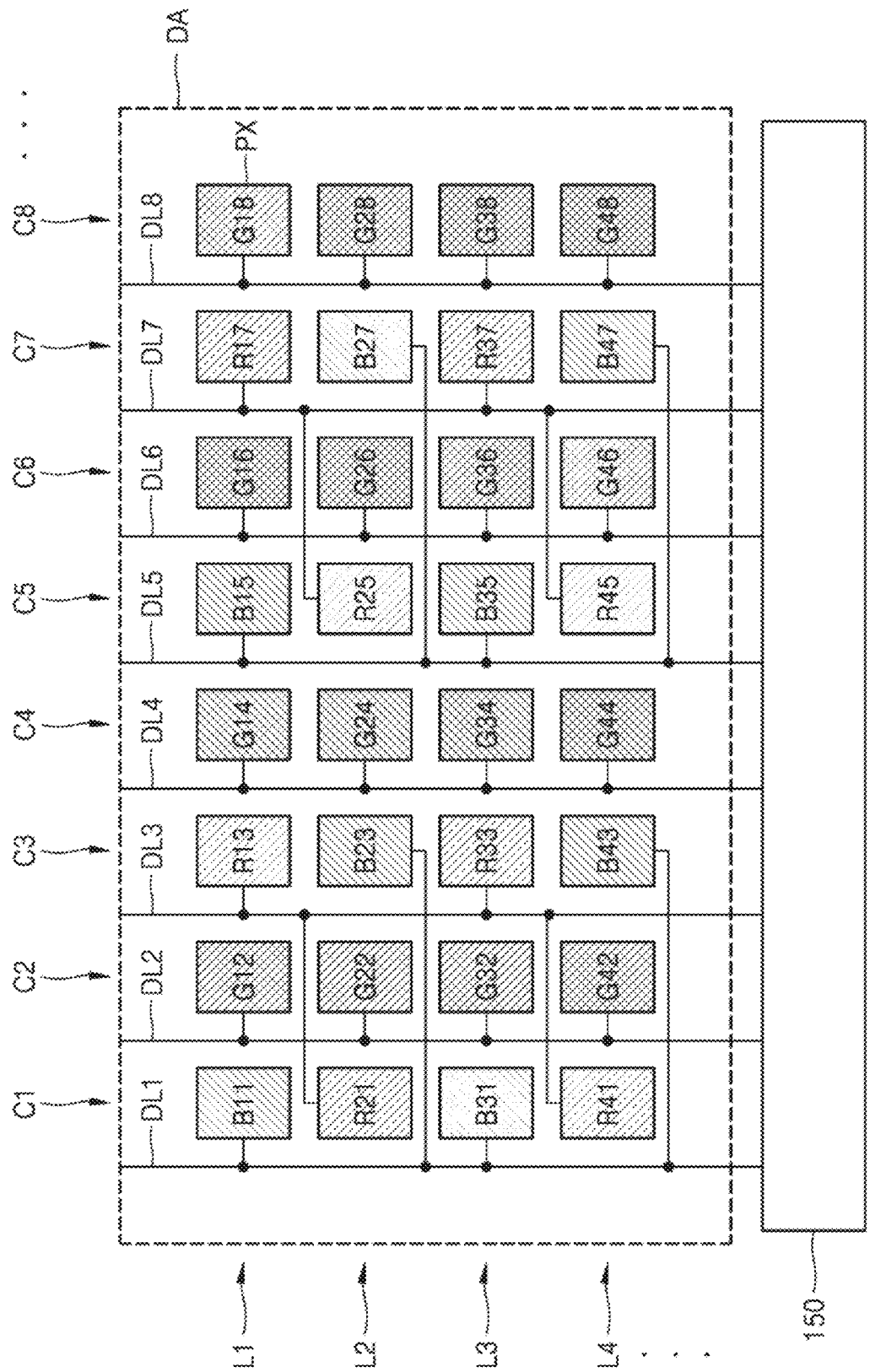
FIG. 15 is a schematic plan view of a connection structure of sub-pixels and data lines of a display apparatus, according to one or more other embodiments.

FIG. 15 is a schematic plan view of a connection structure of sub-pixels and data lines of a display apparatus, according to one or more other embodiments.

Referring to FIG. 15, the display apparatus may include the first to eighth data lines DL1 to DL8 connected to the sub-pixels PX and the data driving circuit 150. FIG. 15 shows the first to eighth data lines DL1 to DL8, but one or more embodiments are not limited thereto.

The sub-pixels PX may include a first sub-pixel of a first color, a second sub-pixel of a second color, and a third sub-pixel of a third color. In one or more embodiments, the first sub-pixel may be a blue sub-pixel B, the second sub-pixel may be a red sub-pixel R, and the third sub-pixel may be a green sub-pixel G.

The sub-pixels PX may include red sub-pixels R13, R17, R21, R25, R33, R37, R41, and R45, blue sub-pixels B11, B15, B23, B27, B31, B35, B43, and B47, and green sub-pixels G12, G14, G16, G18, G22, G24, G26, G28, G32, G34, G36, G38, G42, G44, G46, and G48.

In one or more embodiments, the array of the sub-pixels PX may include a first sub-pixel column C1 of some of the red sub-pixels R and the blue sub-pixels B, a second sub-pixel column C2 of some of the green sub-pixels G, a third sub-pixel column C3 of others of the red sub-pixels R and the blue sub-pixels B, and a fourth sub-pixel column C4 of others of the green sub-pixels G, and the array may have a configuration in which the first sub-pixel column C1 to the fourth sub-pixel column C4 are repeatedly arranged. For example, the fifth sub-pixel column C5 to the eighth sub-pixel column C8 may correspond to, or match, the configuration in which the first sub-pixel column C1 to the fourth sub-pixel column C4 are repeatedly arranged.

In each of the first sub-pixel column C1 and the third sub-pixel column C3, the red sub-pixels R and the blue sub-pixels B may be alternately arranged. The sub-pixels R and the blue sub-pixels B, which are adjacent to each other, may be arranged apart from each other in the first direction (e.g., the y direction). The second sub-pixel column C2 may be arranged between the first sub-pixel column C1 and the third sub-pixel column C3, and the third sub-pixel column C3 may be arranged between the fourth sub-pixel column C4 and the second sub-pixel column C2. In each of the second sub-pixel column C2 and the fourth sub-pixel column C4, the green sub-pixels G may be arranged apart from each other in the first direction (e.g., the y direction).

The blue sub-pixels B in the first sub-pixel column C1 and the red sub-pixels R in the third sub-pixel column C3 may be arranged in the same row in the second direction (e.g., the x direction), which is perpendicular to the first direction (e.g., the y direction). For example, the blue sub-pixel B11 in the first sub-pixel column C1 and the red sub-pixel R13 in the third sub-pixel column C3 may be arranged in the same row.

In other words, the blue sub-pixel B, the red sub-pixel R, and the green sub-pixel G may be arranged in a PenTile™ type.

Referring to FIG. 15, the first sub-pixel column C1 to the eighth sub-pixel column C8 may be arranged adjacent to the first data line DL1 to the eighth data line DL8, respectively.

The blue sub-pixels B11 and B13 in the first sub-pixel column C1 may be electrically connected to the first data line DL1. The red sub-pixels R21 and R41 in the first sub-pixel column C1 may be electrically connected to the third data line DL3.

The green sub-pixels G12, G22, G32, and G42 in the second sub-pixel column C2 may be electrically connected to the second data line DL2.

The red sub-pixels R13 and R33 in the third sub-pixel column C3 may be electrically connected to the third data line DL3. The blue sub-pixels B23 and B43 in the third sub-pixel column C3 may be electrically connected to the first data line DL1.

The green sub-pixels G14, G24, G34, and G44 in the fourth sub-pixel column C4 may be electrically connected to the fourth data line DL4.

The fifth sub-pixel column C5 to the eighth sub-pixel column C8 correspond to the configuration in which the first sub-pixel column C1 to the fourth sub-pixel column C4 are repeatedly arranged. Similarly, the blue sub-pixels B15 and B35 in the fifth sub-pixel column C5 may be electrically connected to the fifth data line DL5. The red sub-pixels R25 and R45 in the fifth sub-pixel column C5 may be electrically connected to the seventh data line DL7.

The green sub-pixels G16, G26, G36, and G46 in the sixth sub-pixel column C6 may be electrically connected to the sixth data line DL6.

The red sub-pixels R17 and R37 in the seventh sub-pixel column C7 may be electrically connected to the seventh data line DL7. The blue sub-pixels B27 and B47 in the seventh sub-pixel column C7 may be electrically connected to the fifth data line DL5.

The green sub-pixels G18, G28, G38, and G48 in the eighth sub-pixel column C8 may be electrically connected to the eighth data line DL8.

Referring to FIG. 15, although locations of the red sub-pixels R and the blue sub-pixels B are changed, each of the first data line DL1 to the eighth data line DL8 is connected to the sub-pixels in one corresponding color, and thus, the data driving circuit 150 may output data signals in one color to each of the first data line DL1 to the eighth data line DL8. Therefore, the amount of power consumed by the display apparatus may decrease.

Also, because the display apparatus includes a cross-connection structure in which the red sub-pixels R in the first sub-pixel column C1 are electrically connected to the third data line DL3 corresponding to the third sub-pixel column C3, and in which the blue sub-pixels B in the third sub-pixel column C3 are electrically connected to the first data line DL1 corresponding to the first sub-pixel column C1, there is no need for separate data lines to decrease the power consumption, and thus, the dead space in the display apparatus may decrease.

Figure 16:
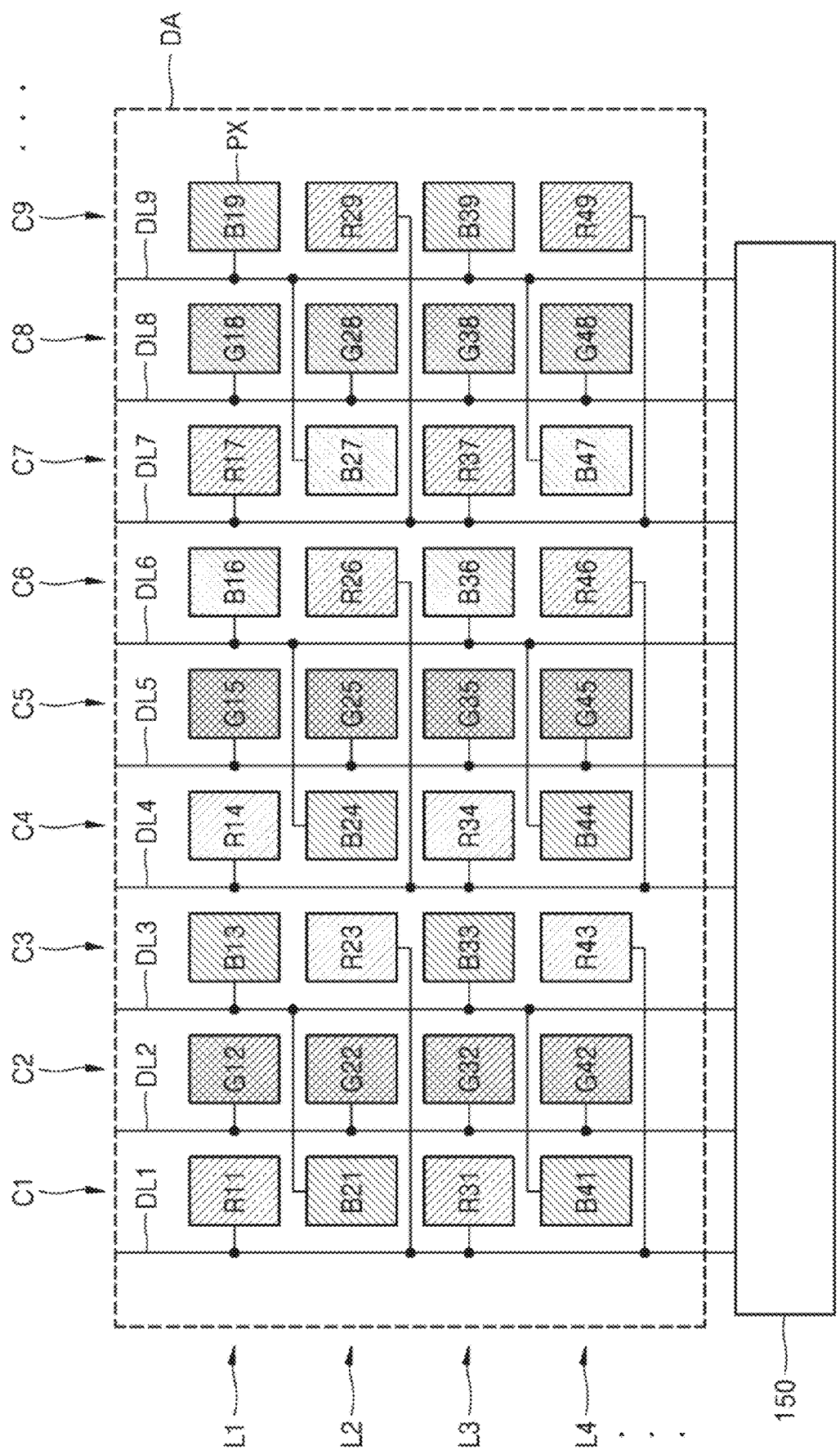
FIG. 16 is a schematic plan view of a connection structure of sub-pixels and data lines of a display apparatus, according to one or more other embodiments.

FIG. 16 is a schematic plan view of a connection structure of sub-pixels and data lines of a display apparatus, according to one or more other embodiments.

Referring to FIG. 16, the display apparatus 1 may include first to ninth data lines DL1 to DL9 connected to the sub-pixels PX and the data driving circuit 150. FIG. 16 shows that the first data line DL1 to the ninth data line DL9, but one or more embodiments are not limited thereto.

The sub-pixels PX may include a first sub-pixel of a first color, a second sub-pixel of a second color, and a third sub-pixel of a third color. In one or more embodiments, the first sub-pixel may be a red sub-pixel R, the second sub-pixel may be a blue sub-pixel B, and the third sub-pixel may be a green sub-pixel G.

The sub-pixels PX may include red sub-pixels R11, R14, R17, R23, R26, R29, R31, R34, R37, R43, R46, and R49, blue sub-pixels B13, B16, B19, B21, B24, B27, B33, B36, B39, B41, B44, and B47, and green sub-pixels G12, G15, G18, G22, G25, G28, G32, G35, G38, G42, G45, and G48.

In one or more embodiments, the array of the sub-pixels PX may include a first sub-pixel column C1 of some of the red sub-pixels R and the blue sub-pixels B, a second sub-pixel column C2 of some of the green sub-pixels G, and a third sub-pixel column C3 of others of the red sub-pixels R and the blue sub-pixels B, and the array may have a configuration in which the first sub-pixel column C1 to the third sub-pixel column C3 are repeatedly arranged. For example, the fourth sub-pixel column C4 to the sixth sub-pixel column C6 correspond to, or match, the configuration in which the first sub-pixel column C1 to the third sub-pixel column C3 are arranged. Also, the seventh sub-pixel column C7 to the ninth sub-pixel column C9 may correspond to the configuration in which the first sub-pixel column C1 to the third sub-pixel column C3 are arranged.

In each of the first sub-pixel column C1 and the third sub-pixel column C3, the red sub-pixels R and the blue sub-pixels B may be alternately arranged. The red sub-pixels R and the blue sub-pixels B, which are adjacent to each other, may be arranged apart from each other in the first direction (e.g., the y direction). The second sub-pixel column C2 may be arranged between the first sub-pixel column C1 and the third sub-pixel column C3, and the green sub-pixels G may be arranged apart from each other in the first direction (e.g., the y direction) in the second sub-pixel column C2.

The red sub-pixel R in the first sub-pixel column C1 and the blue sub-pixel B in the third sub-pixel column C3 may be arranged in the same row in the second direction (e.g., the x direction) perpendicular to the first direction (e.g., the y direction). For example, the red sub-pixel R11 in the first sub-pixel column C1 and the blue sub-pixel B13 in the third sub-pixel column C3 may be arranged in the same row.

Also, the fourth sub-pixel column C4 may be arranged adjacent to the third sub-pixel column C3 and may include the red sub-pixels R and the blue sub-pixels B that are alternately arranged in the first direction (e.g., the y direction). The blue sub-pixel B in the third sub-pixel column C3 and the red sub-pixel R in the fourth sub-pixel column C4 may be arranged in the same row in the second direction (e.g., the x direction). For example, the blue sub-pixel B13 in the third sub-pixel column C3 and the red sub-pixel R14 in the fourth sub-pixel column C4 may be arranged in the same row.

When such a sub-pixel arrangement structure is expressed differently, it may be said that the red sub-pixel R, the blue sub-pixel B, and the green sub-pixel G are arranged in a delta type.

Referring to FIG. 16, the first sub-pixel column C1 to the ninth sub-pixel column C9 may be adjacent to the first data line DL1 to the ninth data line DL9, respectively.

The red sub-pixels R11 and R31 in the first sub-pixel column C1 may be electrically connected to the first data line DL1. The blue sub-pixels B21 and B41 in the first sub-pixel column C1 may be electrically connected to the third data line DL3.

The green sub-pixels G12, G22, G32, and G42 in the second sub-pixel column C2 may be electrically connected to the second data line DL2.

The blue sub-pixels B13 and B33 in the third sub-pixel column C3 may be electrically connected to the third data line DL3. The red sub-pixels R23 and R43 in the third sub-pixel column C3 may be electrically connected to the first data line DL1.

Similarly, the red sub-pixels R14 and R34 in the fourth sub-pixel column C4 may be electrically connected to the fourth data line DL4. The blue sub-pixels B24 and B44 in the fourth sub-pixel column C4 may be electrically connected to the sixth data line DL6.

The green sub-pixels G15, G25, G35, and G45 in the fifth sub-pixel column C5 may be electrically connected to the fifth data line DL5.

The blue sub-pixels B16 and B36 in the sixth sub-pixel column C6 may be electrically connected to the sixth data line DL6. The red sub-pixels R26 and R46 in the sixth sub-pixel column C6 may be electrically connected to the fourth data line DL4.

Also, similarly, the red sub-pixels R17 and R37 in the seventh sub-pixel column C7 may be electrically connected to the seventh data line DL7. The blue sub-pixels B27 and B47 in the seventh sub-pixel column C7 may be electrically connected to the ninth data line DL9.

The green sub-pixels G18, G28, G38, and G48 in the eighth sub-pixel column C8 may be electrically connected to the eighth data line DL8.

The blue sub-pixels B19 and B39 in the ninth sub-pixel column C9 may be electrically connected to the ninth data line DL9. The red sub-pixels R29 and R49 in the ninth sub-pixel column C9 may be electrically connected to the seventh data line DL7.

That is, the first data line DL1 to the ninth data line DL9 may be respectively connected to sub-pixels in one corresponding color. For example, the red sub-pixels R may only be connected to the first data line DL1, the fourth data line DL4, and the seventh data line DL7. The green sub-pixels G may only be connected to the second data line DL2, the fifth data line DL5, and the eighth data line DL8. The blue sub-pixels B may only be connected to the third data line DL3, the sixth data line DL6, and the ninth data line DL9.

Referring to FIG. 10, because the first data line DL1 to the ninth data line DL9 are respectively connected to the sub-pixels in one color, the data driving circuit 150 may supply data signals in one respective color to each data line. Therefore, the amount of power consumed by the display apparatus may decrease.

Also, because the display apparatus includes a cross-connection structure in which the blue sub-pixels B in the first sub-pixel column C1 are electrically connected to the third data line DL3 corresponding to the third sub-pixel column C3, and the red sub-pixels R in the third sub-pixel column C3 are electrically connected to the first data line DL1 corresponding to the first sub-pixel column C1, there is no need for separate data lines to decrease the amount of consumed power, and thus, the dead space in the display apparatus may decrease.

According to one or more embodiments, a display apparatus, in which power consumption decreases and dead space is reduced, may be realized. The scope of the disclosure is not limited by such effects.

It should be understood that embodiments described herein should be considered in a descriptive sense only and not for purposes of limitation. Descriptions of aspects within each of the described embodiments should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
   a substrate;
   a first data line and a second data line above the substrate and extending in a first direction;
   a third data line above the substrate, between the first data line and the second data line, and extending in the first direction; and
   an array of sub-pixels above the substrate, and comprising first sub-pixels for emitting light of a first color, second sub-pixels for emitting light of a second color, and third sub-pixels for emitting light of a third color,
   wherein the array of the sub-pixels comprises:
      a first sub-pixel column adjacent to the first data line, and in which one of the first sub-pixels, which is electrically connected to the first data line, and one of the second sub-pixels, which is electrically connected to the second data line, are alternately arranged in the first direction;
      a second sub-pixel column adjacent to the second data line, and in which an other of the first sub-pixels, which is electrically connected to the first data line, and an other of the second sub-pixels, which is electrically connected to the second data line, are alternately arranged in the first direction; and
      a third sub-pixel column between the first sub-pixel column and the second sub-pixel column, and comprising one of the third sub-pixels that is electrically connected to the third data line.

2. The display apparatus of claim 1, wherein the one of the first sub-pixels in the first sub-pixel column and the other of the second sub-pixels in the second sub-pixel column are in a same row extending in a second direction perpendicular to the first direction.

3. The display apparatus of claim 1, wherein the first data line is configured to supply a first data signal corresponding to the first color, and
   wherein the second data line is configured to supply a second data signal corresponding to the second color.

4. The display apparatus of claim 1 further comprising a fourth data line above the substrate and extending in the first direction,
   wherein the second data line is between the third data line and the fourth data line.

5. The display apparatus of claim 4, wherein the array of the sub-pixels further comprises
   a fourth sub-pixel column adjacent to the second sub-pixel column and comprising a fourth sub-pixel connected to the fourth data line, and
   wherein the second sub-pixel column is between the fourth sub-pixel column and the third sub-pixel column.

6. The display apparatus of claim 4, wherein the array of the sub-pixels further comprises a fourth sub-pixel column adjacent to the second sub-pixel column, and in which an additional one of the first sub-pixels and an additional one of the second sub-pixels are alternately arranged in the first direction, the additional one of the second sub-pixels and the other of the first sub-pixels in the second sub-pixel column being in a same row extending in a second direction that is perpendicular to the first direction.

7. The display apparatus of claim 1, wherein one of the first color and the second color is red,
   wherein the other of the first color and the second color is blue, and
   wherein the third color is green.

8. A display apparatus comprising:
   a substrate;
   a first data line and a second data line above the substrate and extending in a first direction;
   a third data line between the first data line and the second data line; and
   an array of sub-pixels above the substrate, and comprising first sub-pixels respectively comprising first light-emitting diodes for emitting light of a first color, second sub-pixels respectively comprising second light-emitting diodes for emitting light of a second color, and third sub-pixels respectively comprising third light-emitting diodes for emitting light of a third color,
   wherein the array of the sub-pixels comprises:
      a first sub-pixel column adjacent to the first data line, and in which one of the first sub-pixels and one of the second sub-pixels are alternately arranged in the first direction; and
      a second sub-pixel column adjacent to the second data line, and in which an other of the first sub-pixels and an other of the second sub-pixels are alternately arranged in the first direction,
   wherein one of the first light-emitting diodes corresponding to the one of the first sub-pixels in the first sub-pixel column is electrically connected to a 1-1 sub-pixel circuit electrically connected to the first data line,
   wherein an other of the first light-emitting diodes corresponding to the other of the first sub-pixels in the second sub-pixel column is electrically connected to a 2-1 sub-pixel circuit that is electrically connected to the first data line and that is in a same column as the 1-1 sub-pixel circuit, and
   wherein a connection line connecting the 2-1 sub-pixel circuit to the other of the first light-emitting diodes corresponding to the other of the first sub-pixels in the second sub-pixel column crosses the third data line.

9. The display apparatus of claim 8, wherein an other of the second light-emitting diodes corresponding to the other of the second sub-pixels in the second sub-pixel column is electrically connected to a 1-2 sub-pixel circuit electrically connected to the second data line, and
   wherein one of the second light-emitting diodes corresponding to the one of the second sub-pixels in the first sub-pixel column is electrically connected to a 2-2 sub-pixel circuit that is electrically connected to the second data line and that is in a same column as the 1-2 sub-pixel circuit.

10. The display apparatus of claim 8, wherein the one of the first sub-pixels in the first sub-pixel column and the other of the second sub-pixels in the second sub-pixel column are in a same row in a second direction perpendicular to the first direction.

11. The display apparatus of claim 8, wherein the first data line is configured to provide a first data signal of the first color, and wherein the second data line is configured to provide a second data signal of the second color.

12. The display apparatus of claim 10 wherein the array of the sub-pixels further comprises a third sub-pixel column between the first sub-pixel column and the second sub-pixel column and comprising one of the third sub-pixels, and wherein one of the third light-emitting diodes corresponding to the one of the third sub-pixels in the third sub-pixel column is electrically connected to a sub-pixel circuit electrically connected to the third data line.

13. The display apparatus of claim 10 wherein the third data line is configured to provide a third data signal of the third color.

14. The display apparatus of claim 8, wherein the first, second, and third light-emitting diodes each have a stack structure comprising a sub-pixel electrode, an emission layer, and an opposite electrode.

15. The display apparatus of claim 14, wherein the sub-pixel electrode of the one of the first light-emitting diodes in the first sub-pixel column and the sub-pixel electrode of the one of the second light-emitting diodes in the first sub-pixel column overlap the first data line.

16. The display apparatus of claim 14, wherein the sub-pixel electrode of the other of the first light-emitting diodes in the second sub-pixel column and the sub-pixel electrode of the other of the second light-emitting diodes in the second sub-pixel column overlap the second data line.

17. The display apparatus of claim 8, wherein one of the first color and the second color is red, wherein the other of the first color and the second color is blue, and wherein the third color is green.

* * * * *